(12) United States Patent
Theytaz et al.

(10) Patent No.: US 10,429,454 B2
(45) Date of Patent: Oct. 1, 2019

(54) METHOD AND SYSTEM FOR CALIBRATING A PEDOMETER

(71) Applicant: Logitech Europe S.A., Lausanne (CH)

(72) Inventors: Olivier Theytaz, Savigny (CH); Daniel Bonanno, Geneva (CH); Jean-Michel Chardon, Vufflens-la-Ville (CH)

(73) Assignee: Logitech Europe S.A., Lausanne (CH)

( * ) Notice: Subject to any disclaimer, the term of this patent is extended or adjusted under 35 U.S.C. 154(b) by 328 days.

(21) Appl. No.: 15/017,390

(22) Filed: Feb. 5, 2016

(65) Prior Publication Data

US 2017/0227571 A1   Aug. 10, 2017

(51) Int. Cl.
 *G01R 33/02* (2006.01)
 *G01C 22/00* (2006.01)

(52) U.S. Cl.
 CPC ........... *G01R 33/02* (2013.01); *G01C 22/006* (2013.01)

(58) Field of Classification Search
 CPC ....... G01R 33/02; G01C 19/00; G01C 22/006
 See application file for complete search history.

(56) References Cited

U.S. PATENT DOCUMENTS

| | | | |
|---|---|---|---|
| 5,583,776 A | 12/1996 | Levi et al. | |
| 8,976,087 B2 * | 3/2015 | Takeda | G02B 27/0172 345/8 |
| 9,595,181 B2 * | 3/2017 | Katingari | G08B 25/10 |
| 9,694,239 B2 | 7/2017 | Case, Jr. et al. | |
| 9,781,106 B1 * | 10/2017 | Vitus | H04L 63/0861 |
| 9,833,660 B2 | 12/2017 | Case, Jr. et al. | |
| 9,937,381 B2 | 4/2018 | Case, Jr. et al. | |
| 2001/0022828 A1 | 9/2001 | Pyles | |
| 2007/0270721 A1 | 11/2007 | Ananny et al. | |
| 2009/0082994 A1 | 3/2009 | Schuler et al. | |
| 2013/0222214 A1 * | 8/2013 | Takeda | G02B 27/0172 345/8 |
| 2014/0002239 A1 * | 1/2014 | Rayner | G08B 13/1427 340/5.61 |
| 2014/0129177 A1 | 5/2014 | Gyorfi | |
| 2014/0180621 A1 | 6/2014 | Poduri et al. | |
| 2015/0127298 A1 * | 5/2015 | Gangumalla | G01C 22/006 702/160 |
| 2015/0179050 A1 * | 6/2015 | Katingari | G08B 25/10 340/539.13 |
| 2015/0226577 A1 | 8/2015 | Le Grand et al. | |
| 2015/0338236 A1 | 11/2015 | Hoffman et al. | |
| 2016/0058372 A1 | 3/2016 | Raghuram et al. | |
| 2016/0103002 A1 * | 4/2016 | Milota | B81B 7/02 702/89 |
| 2016/0178392 A1 | 6/2016 | Goldfain | |
| 2016/0196758 A1 * | 7/2016 | Causevic | G09B 5/00 434/236 |

(Continued)

OTHER PUBLICATIONS

Non-Final Office Action for U.S. Appl. No. 15/017,401, dated Oct. 23, 2017, 7 pages.

(Continued)

*Primary Examiner* — Telly D Green
(74) *Attorney, Agent, or Firm* — Kilpatrick Townsend & Stockton LLP

(57) ABSTRACT

A head-mounted electronic device includes an inertial motion unit, a location data unit, and an output element. The head-mounted electronic device also includes a processor and a memory coupled to the processor.

18 Claims, 24 Drawing Sheets

(56) References Cited

U.S. PATENT DOCUMENTS

| | | |
|---|---|---|
| 2016/0338636 A1 | 11/2016 | Idrees et al. |
| 2016/0341579 A1* | 11/2016 | Kimura .................. H03L 1/00 |
| 2017/0067933 A1 | 3/2017 | Miller et al. |
| 2017/0153121 A1 | 6/2017 | Hsu |
| 2017/0189752 A1* | 7/2017 | Mohrman ............. G01C 21/16 |
| 2017/0227373 A1 | 8/2017 | Theytaz et al. |
| 2017/0227375 A1 | 8/2017 | Parikh et al. |
| 2017/0227573 A1 | 8/2017 | Theytaz et al. |
| 2017/0227574 A1 | 8/2017 | Theytaz et al. |
| 2017/0261335 A1 | 9/2017 | Hoffman et al. |
| 2017/0266496 A1 | 9/2017 | Case, Jr. et al. |
| 2018/0043211 A1* | 2/2018 | Mohrman ............. G01C 21/16 |

OTHER PUBLICATIONS

Restriction Requirement for U.S Appl. No. 15/017,420, dated Dec. 1, 2017, 6 pages.
Non-Final Office Action for U.S. Appl. No. 15/017,420, dated Mar. 27, 2018, 7 pages.
Non-Final Office Action for U.S. Appl. No. 15/017,401 dated Apr. 19, 2018, 8 pages.
Notice of Allowance for U.S. Appl. No. 15/017,401 dated Oct. 4, 2018, 8 pages.
Non-Final Office Action for U.S. Appl. No. 15/017,413 dated Jul. 31, 2018, 10 pages.
Restriction Requirement for U.S. Appl. No. 15/017,413 dated Apr. 17, 2018, 8 pages.
Non-Final office Action for U.S. Appl. No. 15/017,420 dated Oct. 15, 2018, 9 pages.
Final Office Action for U.S. Appl. No. 15/017,413, dated Jan. 14, 2019, 11 pages.

\* cited by examiner

Trigger condition

No trigger condition

No trigger condition

METHOD AND SYSTEM FOR CALIBRATING A PEDOMETER

CROSS-REFERENCES TO RELATED APPLICATIONS

The following regular U.S. patent applications (including this one) are being filed concurrently, and the entire disclosure of the other application is incorporated by reference into this application for all purposes:

application Ser. No. 15/017,390, filed Feb. 5, 2016, entitled "METHOD AND SYSTEM FOR CALIBRATING A PEDOMETER";
application Ser. No. 15/017,401, filed Feb. 5, 2016, entitled "METHOD AND SYSTEM FOR CALIBRATING A PEDOMETER";
application Ser. No. 15/017,413, filed Feb. 5, 2016, entitled "METHOD AND SYSTEM FOR CALIBRATING A PEDOMETER";
application Ser. No. 15/017,420, filed Feb. 5, 2016, entitled "METHOD AND SYSTEM FOR CALIBRATING A PEDOMETER";
application Ser. No. 15/017,437, filed Feb. 5, 2016, entitled "METHOD AND SYSTEM FOR CALIBRATING A PEDOMETER"; and
application Ser. No. 15/017,447, filed Feb. 5, 2016, entitled "METHOD AND SYSTEM FOR DETECTING FATIGUE IN AN ATHLETE".

BACKGROUND OF THE INVENTION

Sports activities such as jogging, biking, and the like are often performed in conjunction with a device that displays sports-related data, for example, pulse, speed, pace, calories burned, and the like. Such sports-related data can be displayed to the person participating in the sports activities using their sports equipment.

Despite the progress made in the area of sports equipment, there is a need in the art for improved methods and systems related to sports equipment.

SUMMARY OF THE INVENTION

The present invention relates generally to electronic devices. More particularly, embodiments of the present invention provide methods and systems for measuring the distance traveled by a walker/runner using a wearable electronic device such as a head-mounted pedometer. In a particular embodiment, an inertial motion unit is provided that works in conjunction with a display device. In another particular embodiment, the inertial motion unit and a location data unit are provided that work together and in conjunction with a device, for example, a display device, although embodiments are not limited to display devices, that can present information to the user in a variety of forms including audio, video, combinations thereof, or the like. The present invention is not limited to head-mounted pedometers and is also applicable in a variety of activity monitoring applications.

Although some embodiments are discussed in relation to head-mounted implementations (e.g., sports glasses), the present invention is not limited to this form factor and other form factors are included within the scope of the present invention, including a waist belt, a chest belt, and the like. Additionally, although some embodiments discussed herein are exemplified by the tracking of running, the present invention is not limited to this activity and other activities are included within the scope of the present invention, including swimming, biking, cross-country skiing, rowing, paragliding, golfing, ski-touring, and other sports or activities using visual/audio cues. Embodiments of the present invention are not limited to sports-based implementations, but can be applied to a wide variety of occupations such as public service officers including police and firemen, service industries such as cooking, and the like. As described herein, embodiments of the present invention do not require the information to be consumed in the moment since the information can be recorded for later usage.

According to some embodiments of the present invention, a head-mounted device is provided that enables a user to measure the distance covered during an activity (e.g., running or walking), for example, from the beginning of the activity to the end of the activity.

Embodiments of the present invention provide methods and systems in which two or more sensors are coupled to the same processing unit, which is capable of discriminating which sensor to use to continuously measure position. For example, in one implementation, one of the sensors does not measure position, distance or speed directly, but infers it from the analysis of the cyclical (i.e., periodic) movements specific to a sports activity, e.g., acceleration of the trunk or head in a vertical direction (for instance, measured using a pedometer) for running, acceleration of a ski in a horizontal direction for cross-country skiing, wheel rotations in cycling, or the like, based on a cross-sensor calibration that can be performed continuously. The information gathered by the system can be recorded or rendered as a visual or audio signal delivered to the user.

According to an embodiment of the present invention, a head-mounted electronic device is provided. The head-mounted electronic device includes an inertial motion unit and a location data unit. The head-mounted electronic device also includes an output element, a processor, and a memory coupled to the processor.

According to another embodiment of the present invention, an inertial motion unit for a head-mounted electronic device is provided. The inertial motion unit includes an accelerometer and an atmospheric pressure sensor. The inertial motion unit also includes a gyroscope and a magnetometer.

According to yet another embodiment of the present invention, a head-mounted electronic device is provided. The head-mounted electronic device includes an inertial motion unit including an accelerometer, an atmospheric pressure sensor, a gyroscope, and a magnetometer. The head-mounted electronic device also includes an output element, a processor, and a memory coupled to the processor.

According to a specific embodiment of the present invention, a method of calibrating a wearable electronic device is provided. The method includes providing an indication of a target speed for an activity to a user wearing the wearable electronic device and receiving location data from a location data unit during the activity. The method also includes receiving, concurrently with the location data, user stride data associated with the user during the activity and computing a speed of the user as a function of the location data as a function of time. The method further includes populating a table of the speed of the user as a function of the user stride data and calibrating the wearable electronic device in accordance with the table.

According to another specific embodiment of the present invention, a method of calibrating a wearable electronic device is provided. The method includes initiating an activity having a target speed for a portion of the activity and receiving a series of measurements related to a user's stride during the portion of the activity. Each of the series of measurements includes data associated with the user's stride. The method further includes receiving, concurrently with the series of measurements related to the user's stride, a series of measurements of the user's position during the portion of the activity and computing a speed of the user as a function of the user's position as a function of time. The method further includes populating a table of the speed of the user as a function of the data associated with the user's stride and calibrating the wearable electronic device in accordance with the table.

According to yet another specific embodiment of the present invention, a method of determining a speed of a user based on a cadence of the user wearing a wearable electronic device is provided. The method includes accessing a user profile for the user. The user profile includes a stride model. The method also includes measuring acceleration data for the user and detecting impact events using the acceleration data. The method further includes computing the cadence of the user and determining the speed of the user based on the cadence and the stride model.

According to a particular embodiment of the present invention, a method of calibrating a wearable electronic device including a location data unit and an inertial motion unit is provided. The method includes providing a calibration table including default calibration data for the wearable electronic device and determining if location data is available from the location data unit. The method also includes determining if the calibration table has been updated to achieve predetermined thresholds and receiving, from the location data unit, location data associated with the wearable electronic device as a function of time if the location data is available. The method further includes computing a travel speed of the user based on the location data if the location data is available and receiving, from the inertial motion unit, user stride data as a function of time. Additionally, the method includes updating the calibration table using the travel speed and the user stride data and providing data from the updated calibration table to the user.

According to another particular embodiment of the present invention, a method of calibrating a wearable electronic device including a location data unit and an inertial motion unit is provided. The method includes initiating a calibration process and providing a calibration table including default calibration data for the wearable electronic device. The method also includes receiving, from the location data unit, location data associated with the wearable electronic device as a function of time and receiving, from the inertial motion unit, user stride data as a function of time. The method further includes computing a travel speed of the wearable electronic device based on the location data, updating the calibration table using the travel speed and the user stride data, and completing the calibration process.

According to yet another particular embodiment of the present invention, a method of updating a calibration table for a wearable electronic device including a location data unit and an inertial motion unit is provided. The method includes providing the calibration table including default calibration data for the user and receiving, from the location data unit, location data associated with the wearable electronic device as a function of time. The method also includes computing a travel speed of the user based on the location data and receiving, from the inertial motion unit, user stride data as a function of time. The method further includes receiving, from the inertial motion unit, slope data, compute stride metrics using the user stride data, and updating the calibration table using the travel speed and the stride metrics.

According to an embodiment of the present invention, a method of determining travel speed of a user having a wearable electronic device including an inertial motion unit and a location data unit is provided. The method includes receiving, from the inertial motion unit of the wearable electronic device, user stride data and determining that location data is temporarily unavailable from the location data unit. The method also includes computing travel speed using information related to the user stride data and thereafter, determining that the location data is available from the location data unit. The method further includes computing an updated travel speed using information related to the location data and providing the user with the updated travel speed.

According to another embodiment of the present invention, a method of determining interval duration for a user having a wearable electronic device including an inertial motion unit and a location data unit is provided. The method includes setting a target speed for the user during a high intensity portion of interval training and receiving, from the inertial motion unit of the wearable electronic device, user stride data. The method also includes setting a start time for the high intensity portion using the user stride data and receiving, from the location data unit, a series of location data for the user. The method further includes determining, using the series of location data, that the user has reached the target speed, setting a stop time for the high intensity portion using the user stride data, and determining the interval duration as equal to a the difference between the stop time and the start time.

According to yet another embodiment of the present invention, a method of conserving battery power for a wearable electronic device is provided. The method includes receiving user stride data and user location data associated with the wearable electronic device and computing a travel speed for the user as a function of the user stride data and the location data. The method further includes receiving an indication to deactivate a location data unit of the wearable electronic device, deactivating the location data unit, and computing an updated travel speed for the user as a function of the user stride data.

According to a specific embodiment of the present invention, a method is provided. The method includes receiving, by a processor, movement data from a first device corresponding to a movement of an input device. The movement data includes pitch movement data, yaw movement data, and roll movement data. The method also includes receiving, by the processor, acceleration data from a second device corresponding to an acceleration of the input device and detecting a motion of the input device from a reference position based on the movement data and the acceleration data. The motion is defined by a pitch movement from the reference position that exceeds a first predetermined movement threshold value. The pitch movement has an acceleration greater than a predetermined acceleration threshold value. The motion is also defined by a yaw movement from the reference position that is below a second predetermined movement threshold value and a roll movement from the reference position that is below a third predetermined movement threshold value. The method further includes triggering a function on the input device in response to detecting the motion.

According to another specific embodiment of the present invention, a system is provided. The system includes a head-mounted input device, a processor coupled with the input device, and a gyroscope coupled with the input device and controlled by the processor. The gyroscope is operable to track an orientation of the input device including: a pitch of the input device; a yaw of the input device; and a roll of the input device. The system also includes an accelerometer coupled with the input device and controlled by the processor. The accelerometer is operable to track an acceleration of the input device. The system further includes a display device coupled with the input device. The processor triggers a function of the display device in response to detecting a movement of the input device defined by: a rotation in pitch greater than a first predetermined threshold angle relative to an initial position; a rotation in yaw below a second predetermined threshold angle relative to the initial position; and a rotation in roll below a third predetermined threshold angle relative to the initial position.

According to yet another specific embodiment of the present invention, a method is provided. The method includes receiving, by a processor, movement data from a first device corresponding to a movement of the input device. The movement data includes pitch movement data. The method also includes receiving, by the processor, acceleration data from a second device corresponding to an acceleration of the input device and detecting a motion of the input device from a reference position based on the movement data and acceleration data. The motion is defined by a pitch movement from the reference position in a first direction that exceeds a predetermined movement threshold value. The pitch movement has an acceleration greater than a predetermined acceleration threshold value. The motion is also defined by a pitch movement from the reference position in a second direction opposite from the first that exceeds the predetermined movement threshold value. The method also includes triggering a function on the input device in response to detecting the motion.

Numerous benefits are achieved by way of the present invention over conventional techniques. For example, embodiments of the present invention provide a compact wearable system that can provide real time data to the user. By combining a low power consumption inertial motion unit with a location data unit such as a GPS device, embodiments of the present invention are able to provide long battery life and accurate data on the user's speed and distance covered during a workout. Additionally, the inertial motion device can supplement location data provided by the location data unit when the location data unit is not able to provide location data. These and other embodiments of the invention along with many of its advantages and features are described in more detail in conjunction with the text below and attached figures.

DETAILED DESCRIPTION OF SPECIFIC EMBODIMENTS

Figure 1:
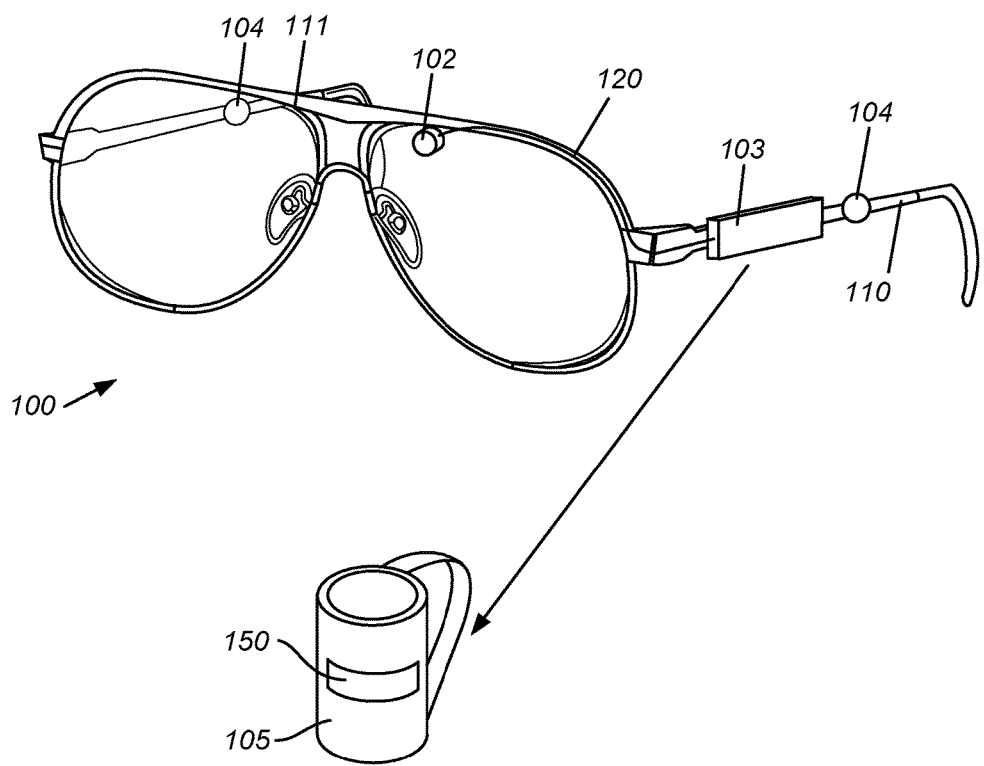
FIG. 1 is a perspective view of a head-mounted electronic device according to an embodiment of the present invention.

Embodiments of the present invention relate to methods and systems for electronic devices. More particularly, embodiments of the present invention provide methods and systems for measuring the distance traveled by a walker/runner using a wearable electronic device such as a head-mounted pedometer.

Sports equipment devices can include location tracking components that utilize a satellite navigation system (e.g., the Global Position System "GPS") to track the path followed by the user when, for instance, running. In addition to GPS, other satellite navigation systems can be utilized, including GLONASS, Beidou, or Galileo. In addition to position tracking functionality, sports equipment devices can include an accelerometer used to count steps (pedometer), thereby allowing the athlete to determine distance covered when running. In other implementations, applications can include step counting, stride measurement, step frequency (i.e., cadence), or the like since the location data covers position→distance→speed. A location tracking component and an accelerometer can be integrated in sports equipment devices. In some implementations, the stride distance is defined using an average value for users that is determined based on the user's height, gender, weight, and the like. In this situation, the computation of the distance covered as being equal to the stride distance times the number of steps is typically only accurate plus/minus 30%. In contrast with these conventional systems based on averages of characteristics of people similar to a user, embodiments of the present invention provide systems that are customized to a particular user based on the user's specific behavior during an activity. Embodiments of the present invention provide more reliable results than conventional systems since the actual characteristics of the user (e.g., stride length) can be close to the model based on group averages, or very far depending on the particular user's characteristics.

An issue presented when location tracking components (e.g., a GPS-based device) are utilized is that the sports equipment device can require two separate units, with the first unit placed on the body (e.g., a GPS receiver) and the second unit on the feet (e.g., a pedometer) that need to be connected and synchronized.

According to embodiments of the present invention, the location data unit and the inertial motion unit, which includes an accelerometer, working in conjunction, can be utilized to calibrate the user's stride with high precision as a function of time during the activity. As an example, as the user walks, runs, or the like, on different surfaces (e.g., level pavement vs. a trail in the woods) the stride changes on the different surfaces. Another example, is climbing and descending, which results in differing stride distances. Moreover, the user's speed can impact the stride, with differing stride length for walking vs. running slowly vs. running fast. The location of the user, for example, at each stride or for a set of strides, as measured using the accelerometer, can be used to determine stride distance with high accuracy. Given accurate stride distance, the system is able to interpolate distance and thus speed when the location data is not available, for example, coverage gaps in dense cityscape and landscape such as a tree canopy, increasing system accuracy in comparison with conventional techniques.

An issue that the inventors have appreciated with conventional systems using GPS tracking is that the signals from the GPS satellites can be blocked, for example, as a result of shadows cast by buildings in downtown areas or by trees in a wooded environment. When the GPS signal is lost, the GPS location accuracy decreases.

Additionally, during interval training in which the user's speed is varying quickly, GPS systems are characterized by a latency that can lead to inaccurate GPS location measurements. Some embodiments of the present invention supplement location measurements from the location data unit using the inertial motion unit in order to improve the accuracy of the location measurements. As an example, for a person performing interval training, a GPS system would not typically capture the change in speed at the beginning of the high intensity portion of an interval as a result of latency. Embodiments of the present invention address this issue by fusing data from the inertial motion unit and the location data unit to provide increased accuracy during the beginning of the intervals as well as during the stable portion of the activity, in which the location data unit provides accurate information.

A further problem with location data units (e.g., GPS-based devices) is that when the user switches on the GPS and starts to run, walk, bike, etc., the GPS takes between 30 seconds and 20 minutes to track the satellites and lock to them (known also as TTFF—time to first fix). This implies that location data is not available for the early portion of the activity. Thus, the user cannot accurately measure the distance covered, their speed, or other related data about their activity. This lack of information will impact the accuracy of the recorded data.

FIG. 1 is a perspective view of a head-mounted electronic device according to an embodiment of the present invention. In the embodiment illustrated in FIG. 1, the head-mounted electronic device 100 is implemented in a form factor of a pair of glasses, which include a micro-projection component 102 for projecting an image that is viewable to a user's eye, a control component 103 and an optional remote control 105. The head-mounted electronic device 100 can also be referred to as a wearable electronic device. Referring to FIG. 1, the micro-projection component 102, which can also be referred to as a display, and the control component 103 can be mounted onto existing glasses serving as the platform for the head-mounted electronic device 100. In some embodiments, electrodes 104 are utilized to sense the user's heart rate, for example, at the temple as illustrated.

In another embodiment, the micro-projection component 102 and the control component 103 can be integral with dedicated glasses or goggles. The micro-projection component 102 can be connected with the control component 103 over a wired or wireless connection. In another embodiment, the micro-projection component 102 and the control component 103 can be integrated into a single device.

As described herein, the micro-projection component 102 can be used to display information to the user, for example, information provided by the control component 103. In addition to visual output, the micro-projection component can integrate audio output in order to communicate information to the user by way of sound, for example, audio messages, vibration, or the like. The control component can include a memory as described in relation to FIG. 4B to record information and make it available for later download. The data measured by the sensors and produced by the control component can be displayed through a user interface that is directly projected into the user's eye in the case of a retinal display. In an alternative embodiment of the invention, the user interface can be displayed on an LCD screen. In another embodiment, the user interface is projected by a device arranged to perform an indirect projection of an image. Thus, embodiments of the present invention provide an integrated system that contrasts with conventional devices that are wrist or foot mounted and require a separate display and feedback system. One of ordinary skill in the art would recognize many variations, modifications, and alternatives.

According to an embodiment, information is displayed to the user through a heads-up display unit integrated into the head-mounted electronic device. By mounting the display at eye level, the information for the user can be displayed in the user's line of sight during the activity. Information on the activity can be displayed using sound, images, numbers such as speed, pace, time elapsed, heart rate, altitude, or the like, plots, video, emission from a set of lights (e.g., LEDs), or the like. In general, three types of data can be displayed: physiological (e.g., heart rate, heart rate zone, etc.); technique (e.g., contact time, time of flight, etc.); and physical (e.g., speed, altitude, etc.). Embodiments of the present invention can provide real time feedback to the user via the heads-up display unit rather than just reporting on past action. The real time feedback enables a feedback loop for the user that facilitates improved training.

Information can be displayed in a variety of manners, including: on-demand; periodically (e.g., every kilometer); alerts based on specific conditions (e.g., variance in stride length); or continuously. Alphanumeric output (e.g., pace at each kilometer) as well as visual outputs (e.g., plots showing trends over time) are included in the information that can be displayed. In some embodiments, a combination of audio and visual information is utilized, for example, an audio prompt may alert the user to look at the display, which can be mounted at eye level to the left or right of the user's line of sight looking straight ahead. By combining audio and visual information, embodiments of the present invention assist the user in interpreting information. For example, if the user has a target speed to run at during interval training, a visual cue (e.g., lights on the right side indicating an increase in speed is needed) can be combined with an audio cue (e.g., an audio sound with an increasing pitch). Similarly for slowing down during the low intensity portion of an interval, lights on the left could light and be accompanied by an audio sound with a decreasing pitch.

Although the embodiment illustrated in FIG. 1 illustrates the remote control 105 as a separate device, in other embodiments, the remote control 105 can be integrated into the head mounted electronic device 100.

The location data unit (e.g., a GPS system) can provide information on the location of the user with high accuracy. Some embodiments of the present invention track the position as a function of time to identify a path that can be overlaid on a map. Additionally, the speed can be determined using the position of the user as a function of time. In some embodiments, the location data unit is used to calibrate the user's stride value in a continuous process, e.g., a real time calibration, during an activity. In addition to the user's stride, other characteristics of the user and the activity can be calibrated continuously, for example, at predetermined increments such as 1 second, 5 seconds, 10 seconds, smaller time intervals, larger timer intervals, or the like. These other characteristics can include speed, slope, and elevation and the data can be recorded in tables or converted into curves, for instance, speed v. stride, speed vs. slope, stride vs. elevation, other combinations, and the like.

Accordingly, embodiments of the present invention can utilize contextual information such as the slope of the terrain, for instance, as the user running uphill, downhill, or on a level surface, to provide the user with an estimate of the current speed of the activity. Since stride changes as a function of the contextual information, a comprehensive model, which can be referred to as a stride length table, can be assembled that includes stride length vs. speed, stride length vs. slope, and the like. Such a table can be converted to a multi-dimensional model as appropriate.

Embodiments of the present invention provide a seamless calibration experience for the user since the location data unit, working in conjunction with the inertial motion unit, can provide real time calibration during the activity. When the location data is not as accurate as desired or unavailable, for example, prior to TTFF, the inertial motion unit can provide the desired speed data based on stored data, for example, the stride length table. Over a longer time period, for example, as the user loses weight or increases their fitness over a period of several months, the real time seamless calibration can update the stride length table to match the user's changed characteristics.

Figure 2:
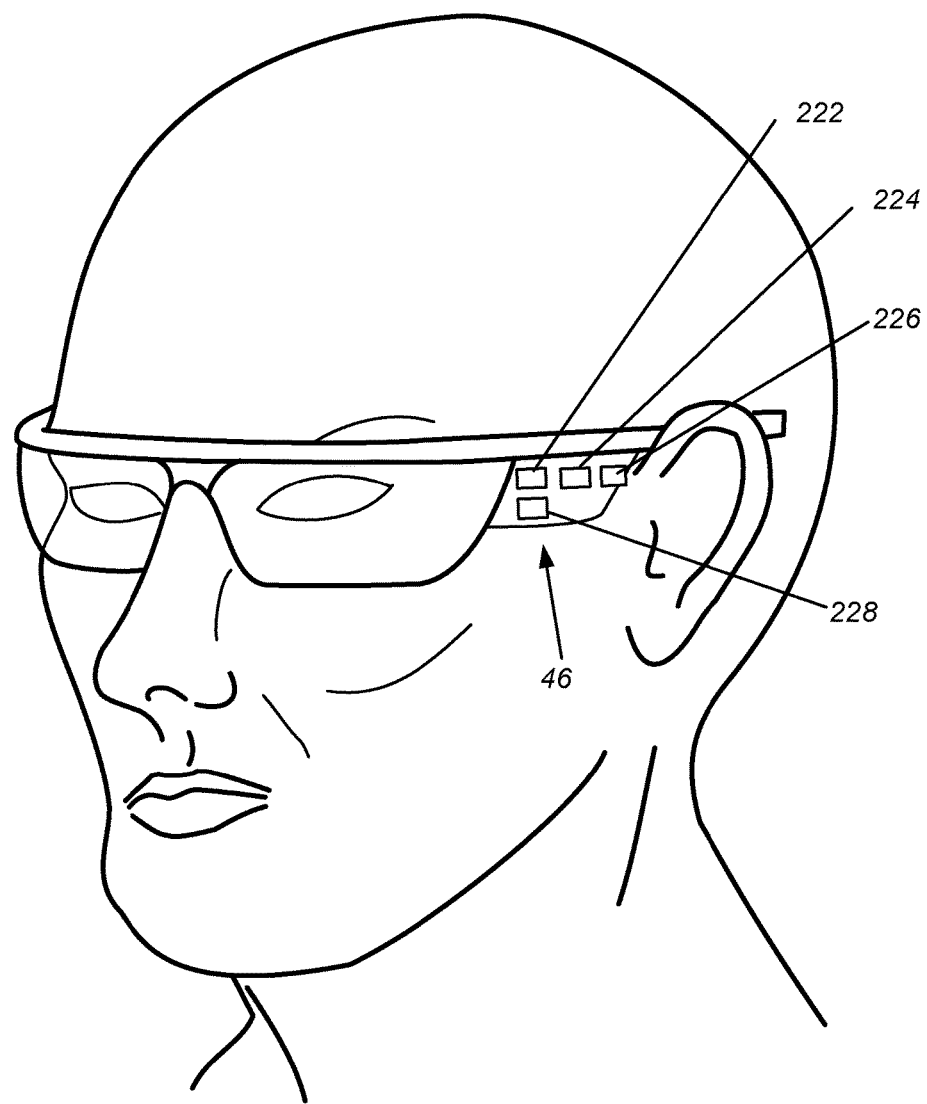
FIG. 2 is a simplified perspective view of a head-mounted electronic device being worn by a user according to an embodiment of the present invention.

FIG. 2 is a simplified perspective view of a head-mounted electronic device being worn by a user according to an embodiment of the present invention. In the embodiment illustrated in FIG. 2, a gyroscope 222, an accelerometer 224, a magnetometer 226, and an atmospheric pressure sensor 228 are integrated into the frame of sports glasses 46. Additional description related to these elements, which can be components of an inertial motion unit, are provided in relation to FIGS. 4A and 4B.

Figure 3:
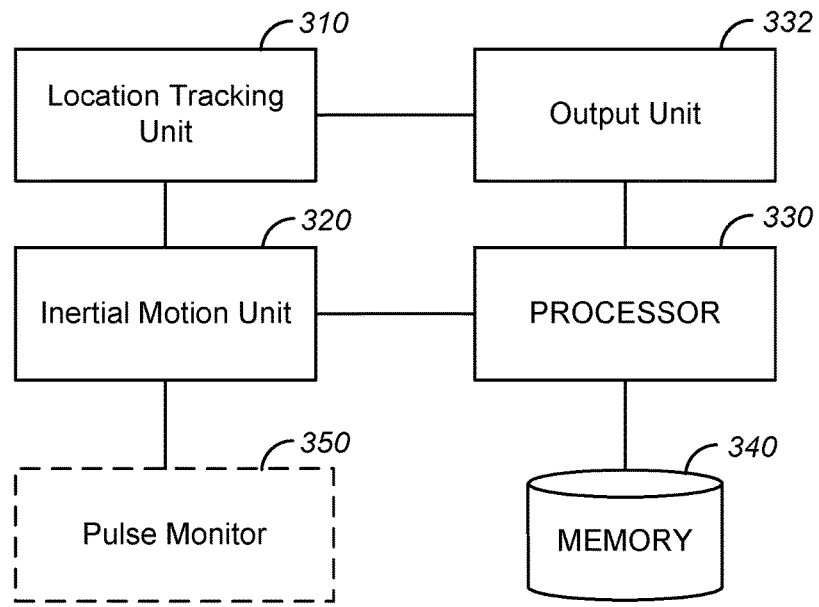
FIG. 3 is a simplified schematic diagram illustrating elements of a wearable electronic device according to an embodiment of the present invention.

FIG. 3 is a simplified schematic diagram illustrating elements of a wearable electronic device according to an embodiment of the present invention. The elements include a location data unit (e.g., a GPS sensor) 310, an inertial motion unit 320, an optional pulse monitor 350, an output unit 332, a processor 330, and a memory 340. In this implementation, a wearable electronic device is provided that includes both an inertial motion unit 320 and a location data unit 310. The output unit 332 can be an audio unit, a visual unit, such as a retinal display or a display that utilizes a set of LEDs, a screen that can display images or video, or the like, or a combination thereof. Working in conjunction, the location data unit can be used to calibrate the inertial motion unit based on accurate location data. When the location data is not available or experiences a decrease in accuracy, the inertial motion unit can provide information on the user's movement to compensate for the lack or inaccuracy of the location data and supplement the location data. Referring back to FIG. 1, one or more elements illustrated in FIG. 3 can be implemented as elements of the control component 103.

As described herein, the various elements of the wearable electronic device can be synchronized using a common time base in order to facilitate data fusion. In some embodiments, the elements of FIG. 3 are implemented in a single integrated system. In other embodiments, separate components are utilized and assembled to form the system. The processor 330 receives data from the location data unit 310 and the inertial motion unit 320 and processes this data to provide output that can be displayed on the display 102. In some embodiments, an optional pulse monitor 350 is provided. As an example, the optional pulse monitor can be implemented in the nose bridge of the glasses in one embodiment, providing the user's pulse as a function of time.

Figure 4A:
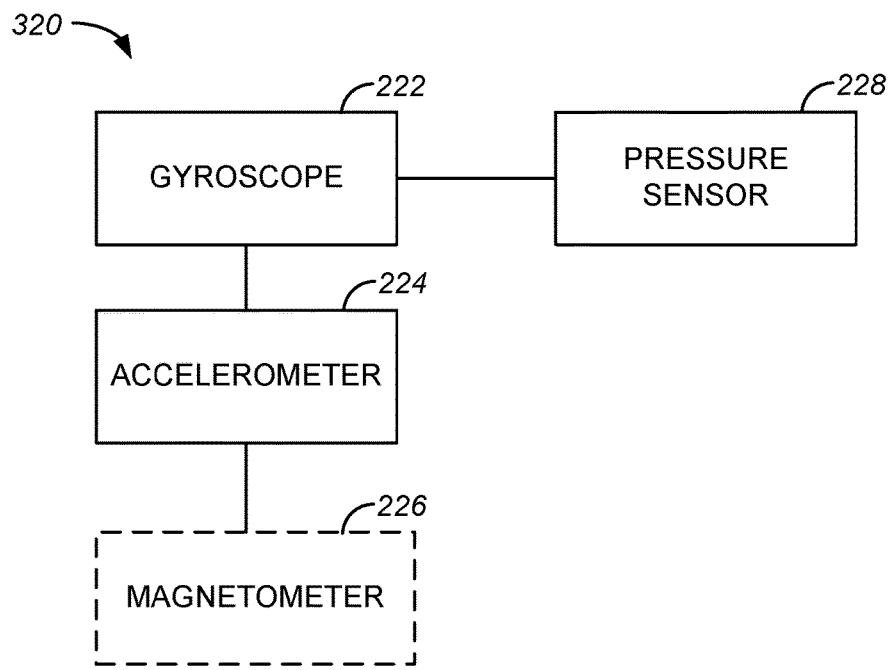
FIG. 4A is a simplified schematic diagram illustrating an inertial motion unit according to an embodiment of the present invention.
Figure 4B:
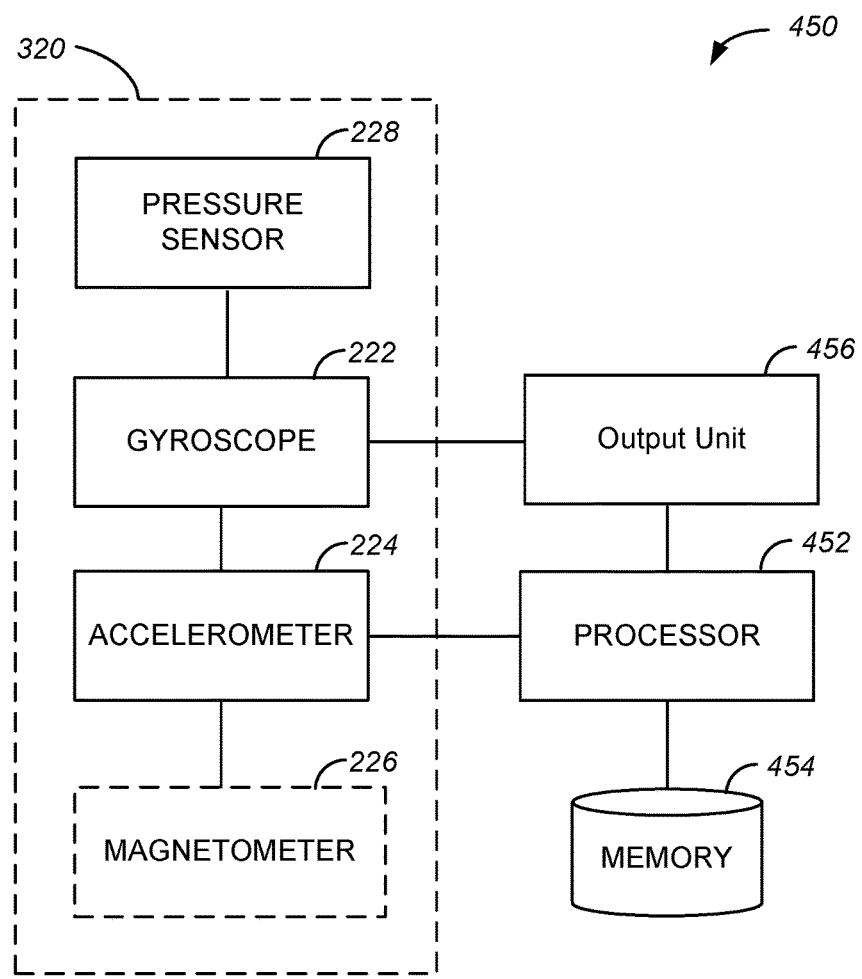
FIG. 4B is a simplified schematic diagram illustrating a wearable electronic device according to another embodiment of the present invention.

As described herein, some embodiments utilize both a location data unit 310 and an inertial motion unit 320, whereas in other embodiments, as illustrated in FIG. 4B, the location data unit is optional. Thus, although FIG. 3 illustrates location data unit, not all embodiments utilize this element, for example, to reduce system cost.

FIG. 4A is a simplified schematic diagram illustrating an inertial motion unit according to an embodiment of the present invention. The inertial motion unit 320 could be integrated into a head-mounted device such as a pair of glasses to provide activity information for a user independent of a location data unit such as a GPS module. In this embodiment, the inertial motion unit 320 can provide speed, distance, and the cadence for instance, in applications where the user is not interested in recording position with respect to a map. In some cases, the system including location tracking as illustrated in FIG. 3 could be operated at a low power mode by disabling the location tracking, resulting in an inertial motion unit based system.

In an embodiment, the elements illustrated in FIG. 3 other than the location data unit 310 are included in a wearable electronic device. In this embodiment, the wearable electronic device including the inertial motion unit can be calibrated using an external or separate location tracking device (e.g., a GPS device or an electronic device with GPS capability) to improve the accuracy of the wearable electronic device in comparison to conventional techniques.

Figure 6A:
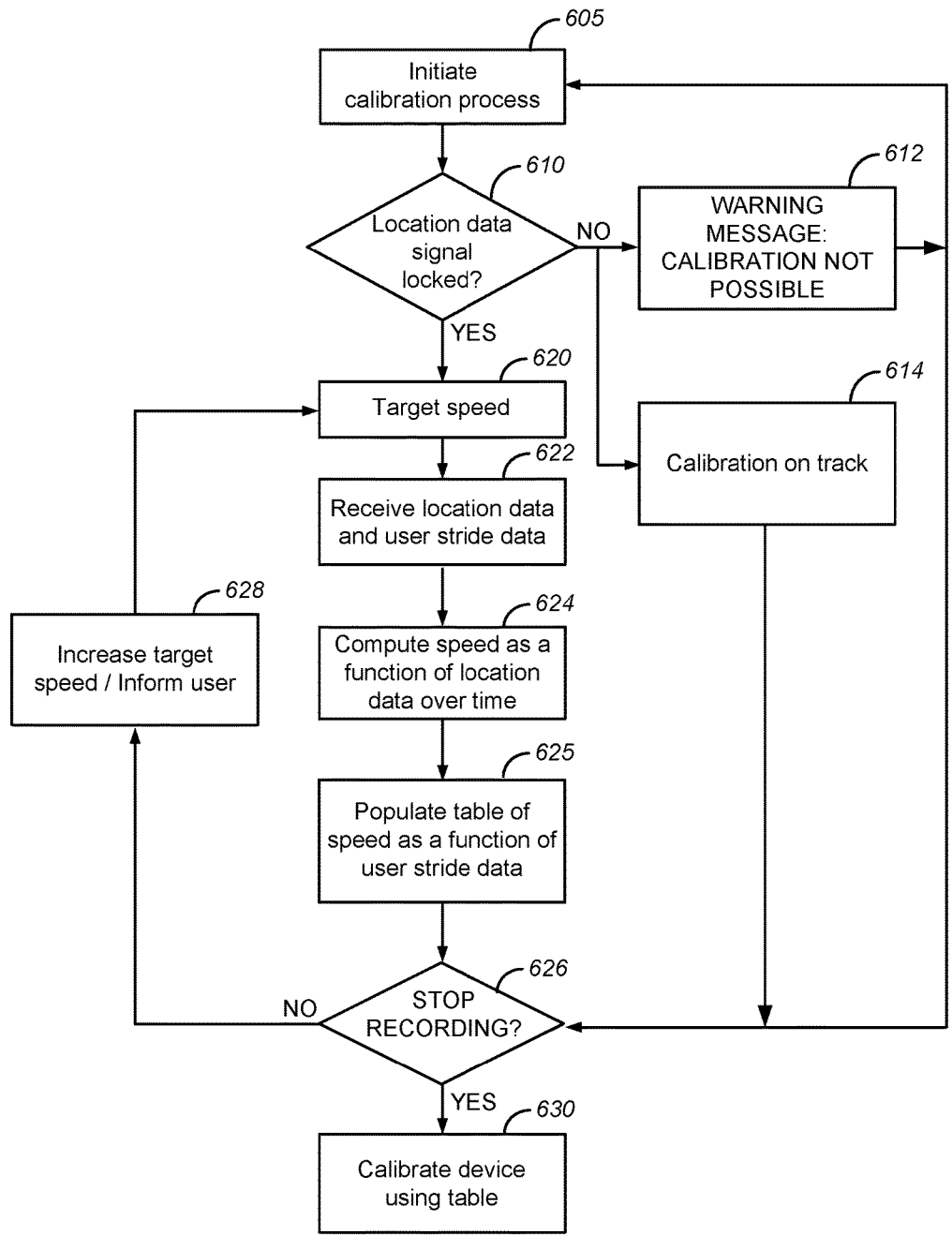
FIG. 6A is a simplified flowchart illustrating a method of performing initial calibration for a wearable electronic device according to an embodiment of the present invention.
Figure 6B:
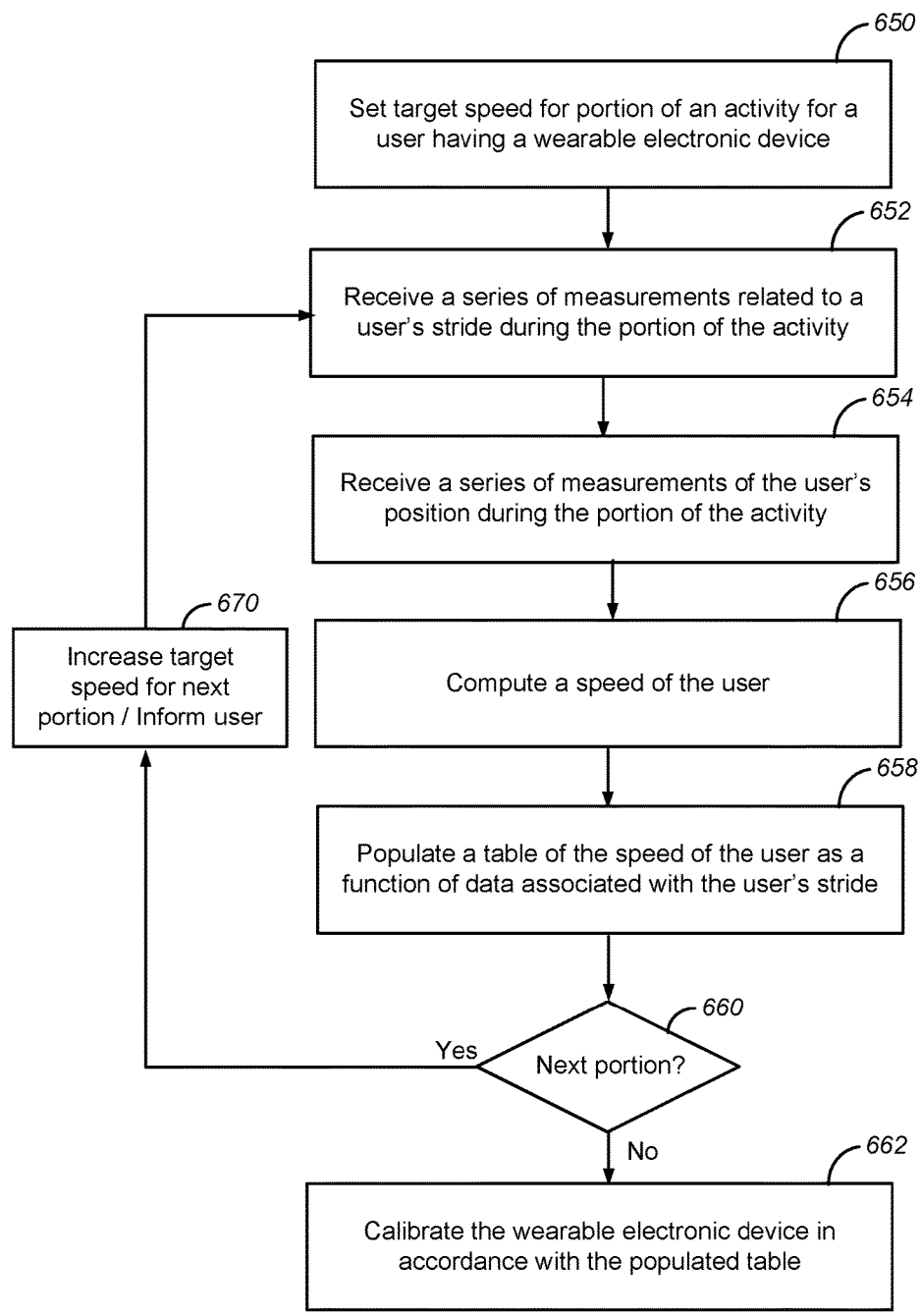
FIG. 6B is a simplified flowchart illustrating a method of calibrating a wearable electronic device according to an embodiment of the present invention.

Calibration of an inertial motion unit based system is described in relation to FIGS. 6A and 6B in which a separate device including location tracking (e.g., a mobile phone with a GPS unit) can be carried by the user during the initial calibration process. Given the location data from the separate device, the stride length is determined and used to calibrate the system, obviating the use of the separate device during subsequent operation. Calibration updates can be performed as desired.

Referring to FIGS. 1 and 4A, the control component 103 of the head-mounted electronic device 100 can be implemented to include an inertial motion unit 320. As described below, the inertial motion unit 320 can include sensors, a processor, and memory, including a gyroscope 222, an accelerometer 224, a magnetometer 226, and an atmospheric pressure sensor 228, among other sensors. According to embodiments of the present invention, the inertial motion unit can be used to accurately measure a user's speed/distance without the assistance of a location data unit. Additionally, as described in relation to FIG. 7C, the inertial motion unit can be used in conjunction with a location data unit to compensate for the temporary lack of location data due, for example, to latency, locking latency, signal loss, and the like. Accordingly, the combination of the inertial motion unit with the location data unit provides accurate information for the user in a wide variety of conditions.

According to an embodiment of the present invention, each of the elements of the inertial motion unit 320 provides information that can be utilized separately or in combination. As an example, the gyroscope 222 can be used to measure direction changes as the user moves (e.g., as a runner changes direction during a run). Additionally, the gyroscope can be used to detect movement of the user's head, which can then be used to trigger display of information on the heads-up display. As an example, in order for the user to be presented with data on their speed or other suitable metrics, the user can take a predetermined action, for example, tilting their head down, tilting their head down and then back up, quickly looking to the right or left, or the like. The gyroscope will detect the motion of the user's head and trigger display of the desired information in an on-demand manner. Additional description related to triggering of information output is provided in relation to FIGS. 16-19. Thus, the user is able to obtain data related to the activity without manual entry of the request using their hands. In some embodiments, specific motions can be detected using the gyroscope in order to discriminate against common motions that occur during the activity, including looking down at your watch, looking to the side, for example, down a street at an intersection to look for traffic, and the like. One of ordinary skill in the art would recognize many variations, modifications, and alternatives.

The accelerometer 224 can sense the shock associated with the user's foot hitting the ground and, therefore, can measure the steps that the runner makes since the stride length times the frequency is the runner's speed. In an embodiment, a three-axis accelerometer is utilized in which the vertical (head-up) acceleration values are used to determine the user's cadence. As the user's foot hits the ground, the accelerometer experiences a change in acceleration that can be used to determine the cadence. These acceleration changes associated with strides as a function of time can be used to measure the speed of the runner and the distance run by the runner. Using a three-axis accelerometer, it is possible to use one axis to measure the stride/speed while the other axes are used to discriminate natural events like, for example, when the runner looks at a watch that is on his/her wrist.

The magnetometer 226, which may be a three-dimensional magnetometer, is able to measure the magnetic field of the earth in order to indicate North with reference to the earth's magnetic field and provides data associated with a compass. By using a 3D magnetometer, North can be determined even if the magnetometer's axes are not aligned with the horizontal. The magnetometer can detect changes in the user's direction, which can be used to reconstruct the path independent of or in place of the location tracking data when the location data unit is not operative. Using the magnetometer, the user's route can be tracked based on the user's starting point, the directions that the user is moving during the activity (e.g., represented by segment vectors), and the speed in a manner similar to dead reckoning.

The atmospheric pressure sensor 228 can provide data on the altitude of the user as well as the altitude change that the user experiences during use. In some embodiments, the data from the atmospheric pressure sensor can be utilized to determine periods during which the user is running on level surfaces, uphill, or downhill. In some implementations, the absolute altitude above sea level (or other suitable reference) is not needed and the relative altitude change is sufficient, providing information on the altitude gain/loss during a predetermined period. During training routines, the user is able, therefore, to obtain information on climbing and descending rates as a function of time (i.e., the profile of the activity) during the training routine. The elevation data is available to the user throughout the activity (e.g., immediately), in contrast with systems that record elevation data (e.g., by tracking GPS position) but only make it available after completion of the activity and downloading of the data. One of ordinary skill in the art would recognize many variations, modifications, and alternatives. As described more fully herein, data provided by the atmospheric pressure sensor 228 can be used to populate a calibration table including user speed as a function of the slope of the terrain, the user's stride length, and the like. Accordingly, changes in slope can be taken into account using such data.

By combining distance data coming from the accelerometer 224 with the direction data of the magnetometer 226, the processor 330 can reconstruct the path followed by the runner. The tight coupling between the location data (e.g., provided by a GPS sensor) and the movement sensing performed by the motion sensors of the inertial motion unit 320 offers a unique perspective on the usage context, e.g., whether the user is following a predefined training program.

In some embodiments, a system is provided in which the inertial motion unit 320 provides functionality absent a location data unit. As an example, a wearable activity tracking system is provided that is inexpensive, light weight, and simple. The inertial motion unit is calibrated, for example, using a smart phone or other device incorporating a location data unit such as a GPS location determination system. During a calibration activity such as running, the user possesses both the inertial motion unit and the location data unit. The location data unit is used to calibrate the inertial motion unit that measures the user's stride. During subsequent use, the user is not required to utilize the location data unit, but can rely on the inertial motion unit to provide high accuracy measurements of the activity.

FIG. 4B is a simplified schematic diagram illustrating a wearable electronic device according to another embodiment of the present invention. The wearable electronic device shares common elements with the inertial motion unit 320 described in FIG. 4A and the description provided in FIG. 4A is applicable to the elements illustrated in FIG. 4B as appropriate.

Referring to FIG. 4B, the wearable electronic device 450 includes an inertial motion unit 320 that can include an accelerometer 224, a pressure sensor 228, a gyroscope 222, and an optional magnetometer 226. Additionally, the wearable electronic device 450 includes a processor 452, an output unit 456, which can be an audio/visual display, and a memory 454 coupled to the processor. The functionality of the various elements has been described in detail in relation to FIGS. 3 and 4A and that description is applicable to FIG. 4B as appropriate.

The wearable electronic device 450 can be utilized as a stand-alone device independent of a location data unit. In some implementations, disabling of the location data unit in the device illustrated in FIG. 3 will result in the functionality associated with the elements illustrated in FIG. 4B.

Figure 5:
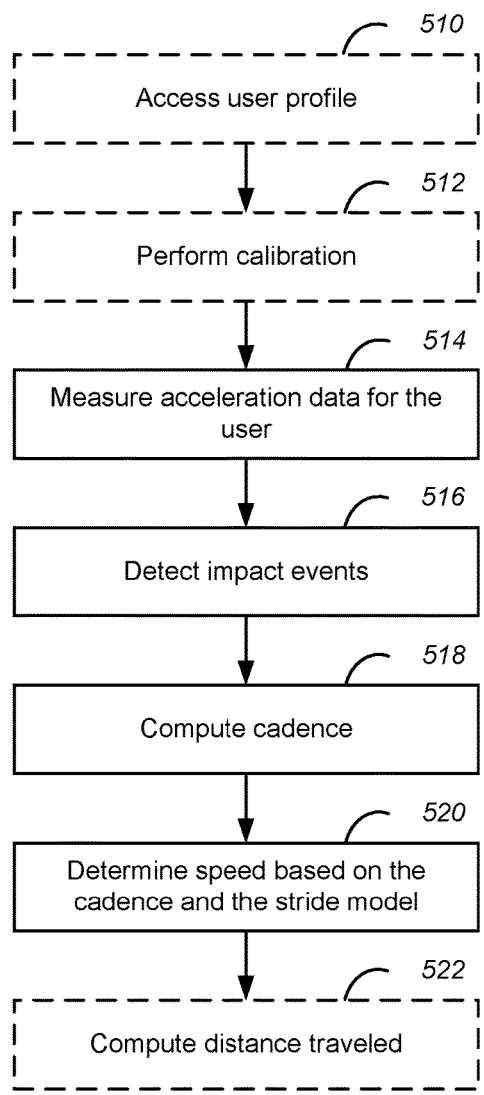
FIG. 5 is a simplified flowchart illustrating a method of estimating a user's speed and distance traveled using an inertial motion unit according to an embodiment of the present invention.
Figure 9:
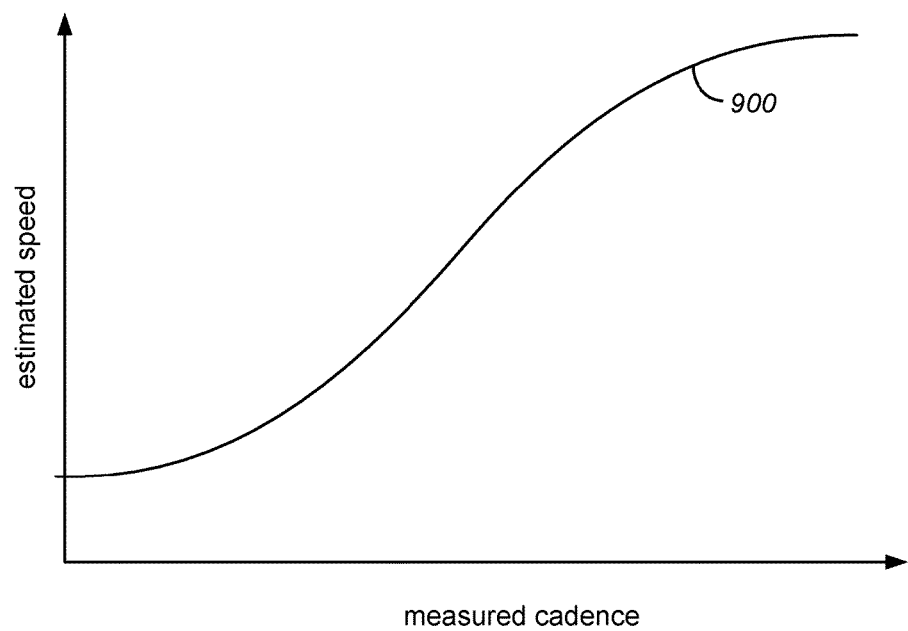
FIG. 9 is a plot illustrating an initial model of estimated speed vs. measured cadence for a user according to an embodiment of the present invention.

FIG. 5 is a simplified flowchart illustrating a method of estimating a user's speed and distance traveled using an inertial motion unit according to an embodiment of the present invention. The method can be utilized to perform initial calibration of the inertial motion unit in the absence of location data. The inertial motion unit can be implemented as illustrated in FIG. 4A and can be a component of the elements of the electronic wearable device 100 illustrated in FIG. 1. The method includes receiving a user profile (510). The user profile can include information about the user including gender, height, weight, and other pertinent data. Based on the user profile, an initial model of the estimated speed as a function of measured cadence is defined. As an example, FIG. 9 is a plot illustrating an initial model 900 of estimated speed vs. measured cadence for a user according to an embodiment of the present invention.

Figure 10:
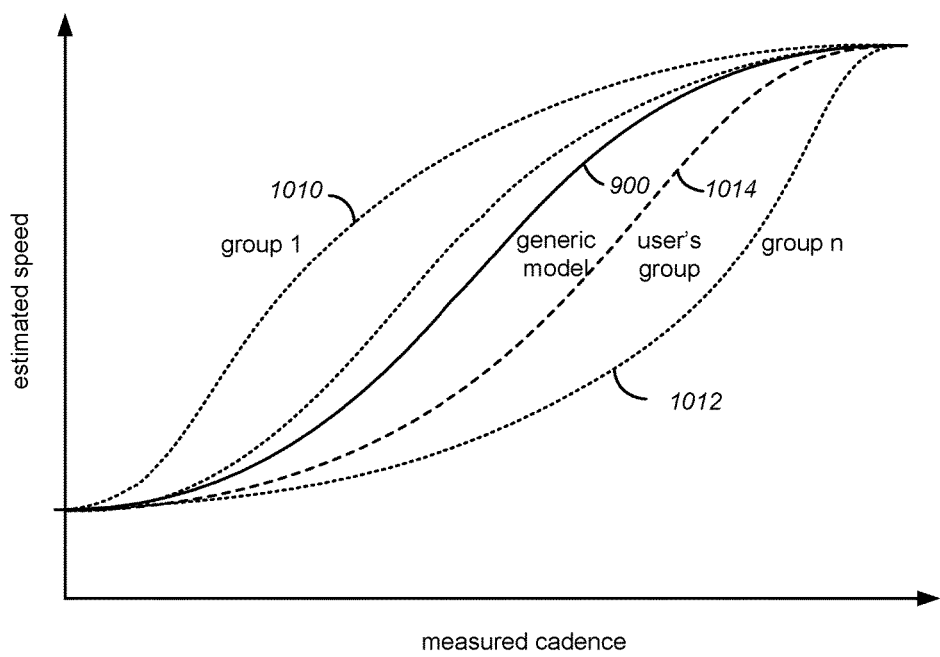
FIG. 10 is a plot illustrating an improved model of estimated speed vs. measured cadence for a user according to an embodiment of the present invention.

In some embodiments, a network effect is achieved as additional information is available for the user. As users utilize the systems described herein, a statistical analysis of the community of users having common demographics, e.g., gender, height, and age, can be used to refine the initial model illustrated in FIG. 9. By comparing a particular user to a population subgroup, deviation from the norm for the person in one characteristic can be used to compute deviation from the norm in other characteristics. FIG. 10 is a plot illustrating an improved model of estimated speed vs. measured cadence for a user according to an embodiment of the present invention. As illustrated in FIG. 10, sub-groups for group 1 (curve 1010) through group n (curve 1012) can be defined and assigned unique curves of estimated speed vs. measured cadence. As illustrated in FIG. 10, the user's group 1014 enables the inertial motion unit to provide a model for the user that is more accurate and as the number of users increases, the precision of the model increases.

As an example, considering a system that bases stride length on population averages, a user's stride length could be set at 1 meter as a default value. Once the user provides some personal information, for example, height, gender, and age, the estimate for the user's stride length can be adjusted, for example, to 95 cm, which is more likely given their characteristics. The larger the population with the user's characteristics, the more accurate the refined estimate.

Figure 7A:
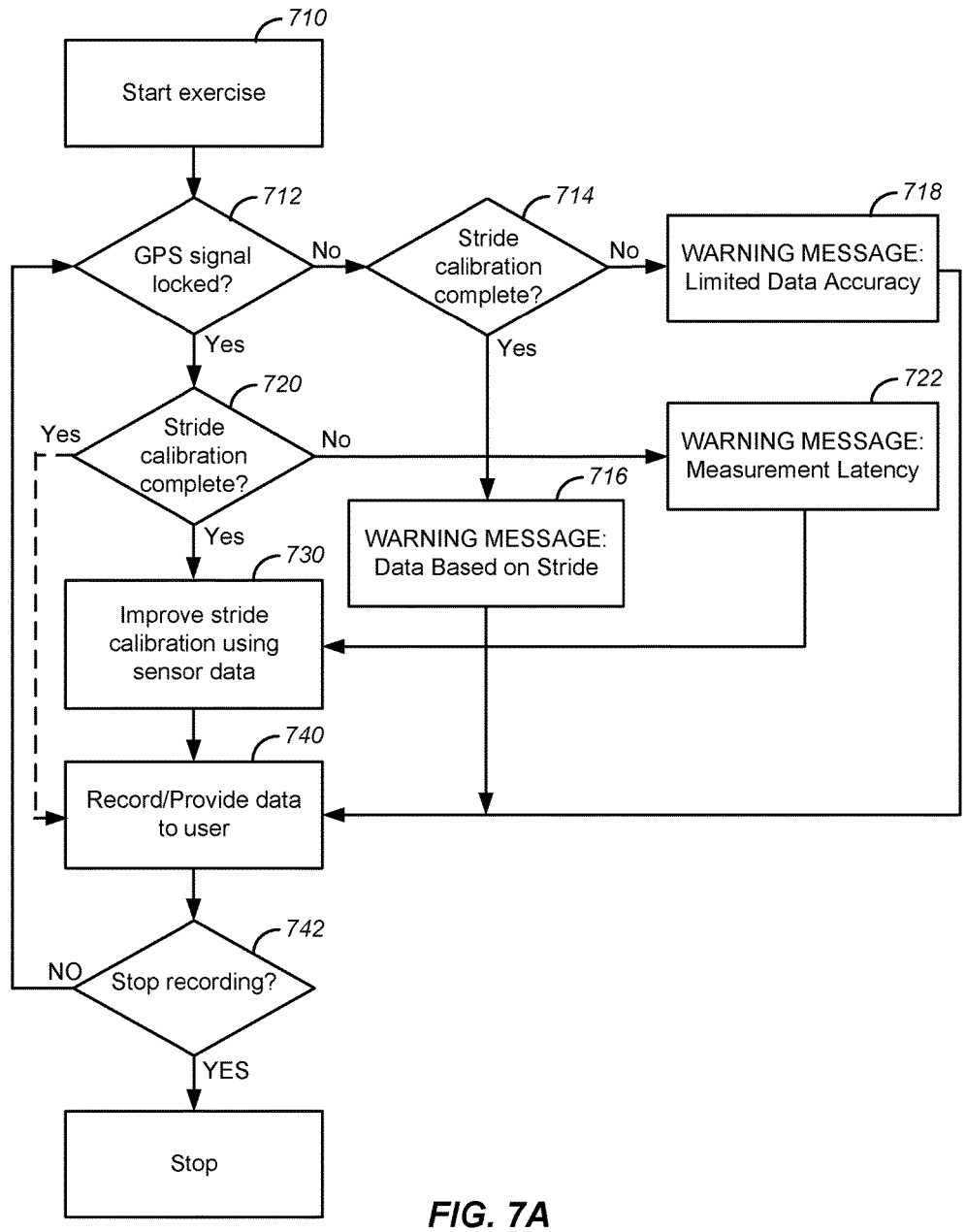
FIG. 7A is a simplified flowchart illustrating a method of updating calibration data for a wearable electronic device according to an embodiment of the present invention.
Figure 7B:
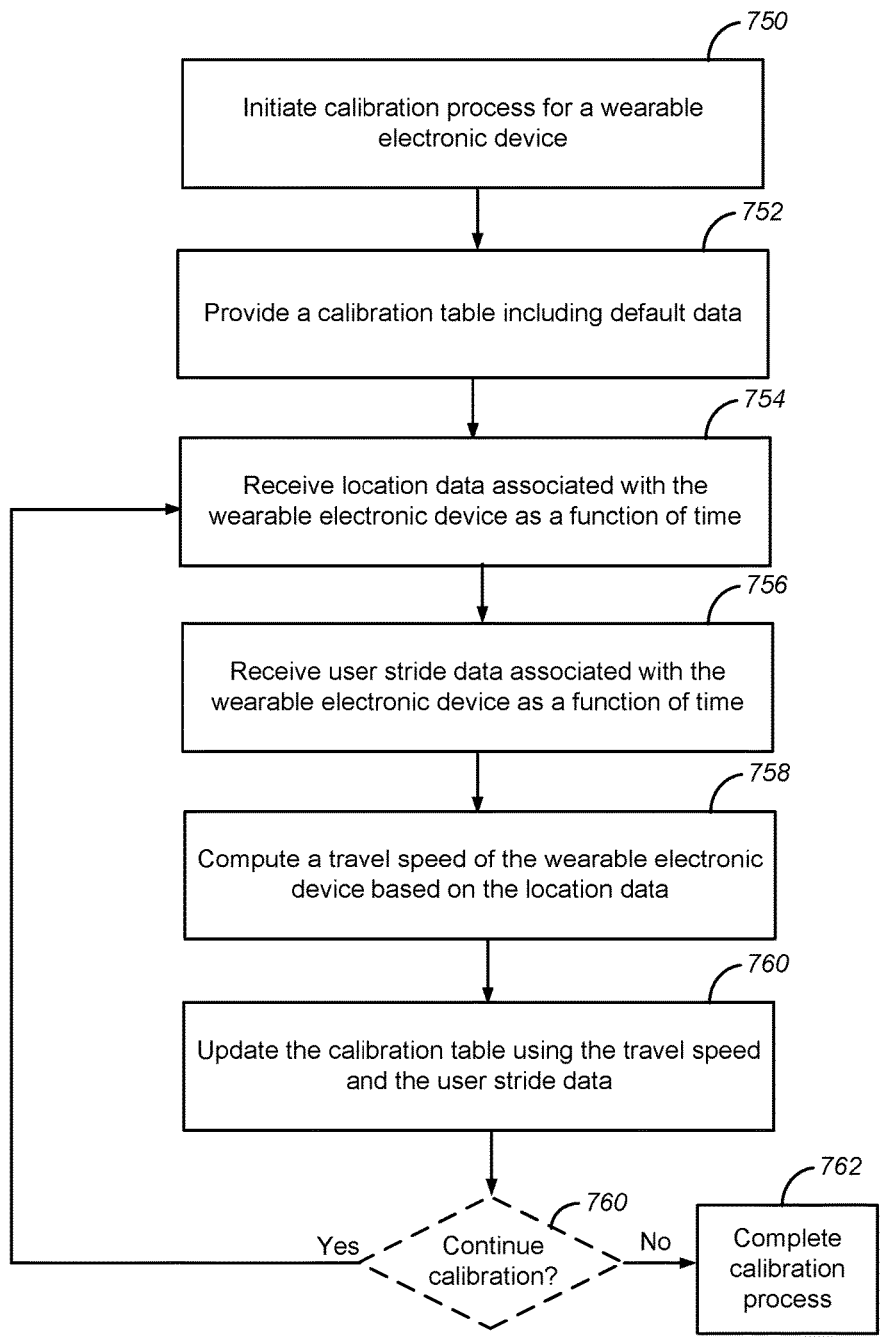
FIG. 7B is a simplified flowchart illustrating a method of calibrating a wearable electronic device including a location data unit and an inertial motion unit according to an embodiment of the present invention.
Figure 12:
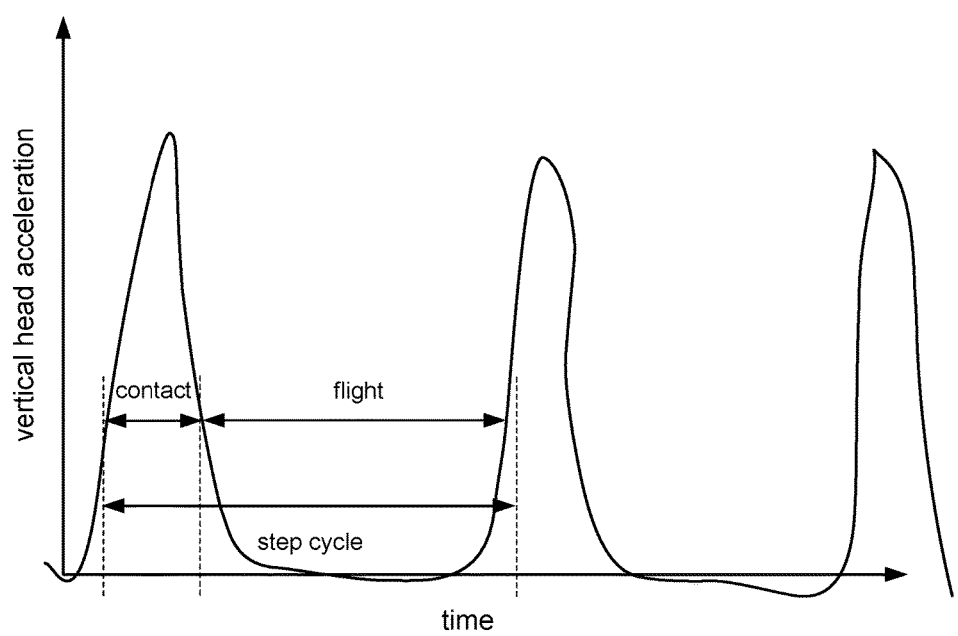
FIG. 12 is a plot illustrating vertical head acceleration as a function of time according to an embodiment of the present invention.

The method also includes performing an optional calibration process (512). The calibration can be a one-time calibration for a system that does not include a location data unit as an integral unit, but can utilize data from a separate location data unit as discussed in relation to the method illustrated in FIG. 6A. Alternatively, the calibration can be a calibration process (e.g., a continuous calibration process) using a location data unit as illustrated in FIGS. 7A and 7B. The acceleration of the user's head is measured (514) using the accelerometer that is part of the inertial motion unit. FIG. 12 is a plot illustrating vertical head acceleration as a function of time according to an embodiment of the present invention. As illustrated in FIG. 12, the acceleration profile can be characterized by several parameters including contact time, flight time, the step cycle time, and the stride frequency, which is the inverse of the step cycle time. It should be noted that in a wrist-mounted device, the contact time may not be able to be measured based on the motion of the arm.

Referring to FIG. 12, embodiments of the present invention compute the flight time ratio as the flight time (i.e., the step cycle time minus the contact time) divided by the step cycle time. In other embodiments, the contact time ratio (contact time divided by the step cycle time) can be utilized in conjunction with or in place of the flight time ratio since they are related to each other. The accelerometer of the inertial motion unit measures the acceleration of the head as illustrated in FIG. 12. Every time the foot impacts on the ground, there is negative acceleration, whereas when the person is between impacts, both feet are off the ground for a period referred to as the flight time. The slower a person runs, the longer the contact time is in relation to the total step cycle time. Accordingly, it is possible to determine that the person is actually running at slow speed based on the flight time ratio and therefore a better speed estimate is achieved. Because the relationship between speed and cadence is not linear with a very low slope for low speeds (e.g., 7 to 10 km/hr), the difference between walking and jogging and running slowly results in a difference in the cadence as well as in the pattern of how long the foot rests on the ground at each and every step. Some embodiments of the present invention, therefore, utilize the flight time ratio in addition to or in place of the computation of speed based on cadence, for which the frequency of impacts of the feet on the ground is tracked by measuring the maximum in amplitude of the vertical head acceleration/deceleration. Accordingly, some embodiments of the present invention enable the system to increase the measurement of the user speed without the need for location tracking information.

The inventors have determined that the use of a head-mounted device enables superior isolation of the user's movement than achievable using wrist-mounted devices. As a result, the mounting of the wearable electronic device on a user's head provides benefits not available using conventional systems. As an example, for a wrist-mounted device, the motion of the arms may not correspond to the user's stride, resulting in erroneous stride number and length measurements. Since the head moves with the trunk and has the same acceleration profile as the body's center of gravity, the head is a stable platform that provides an accurate proxy for the body's motion and acceleration measured at the head is an accurate indicator of the user's strides. Generally, during an activity such as running or walking, the head is substantially vertical and the eyes are level. Even as the slope changes, the eyes tend to stay substantially level.

Figure 11:
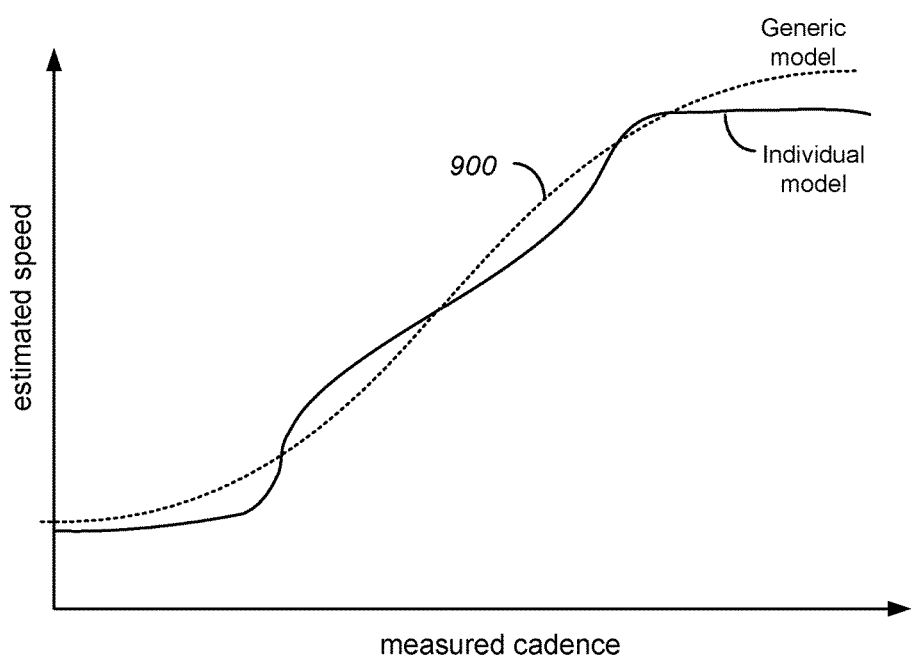
FIG. 11 is a plot illustrating a customized model of estimated speed vs. measured cadence for a user according to an embodiment of the present invention.

The method includes detecting impacts associated with the acceleration peaks that define the impact of the user's feet on the ground (516). The cadence is computed (518) based on the frequency of the steps and can be determined without distinguishing between left and right feet. Given the measured cadence, the speed can be computed based on the model for the user as illustrated in FIGS. 9-11. As discussed above, the initial or generic model illustrated in FIG. 9 utilizes a universal stride length that is a function of cadence. The improved model illustrated in FIG. 10 utilizes a specific stride length to cadence relationship that is specific to a subgroup of the population to which the user is associated based, for example, on gender and height. The customized or individual model illustrated in FIG. 11 is an individual model that relies on a calibrated stride as a function of cadence relationship. Given the speed of the user, the distance can be computed as the integration of the speed over time (522) and then the data can be displayed to the user with a high accuracy.

Referring once again to FIG. 5, a summary of the method of determining a speed of a user based on a cadence of the user wearing a wearable electronic device is provided as follows. The method includes accessing a user profile for the user (510). The user profile includes a stride model, which can be a default stride model based on the user's gender and height. The user profile can be filled out by the user after initial purchase or the device can ship with default models. The method also includes measuring acceleration data for the user (512). In some embodiments, the wearable electronic device is head-mounted and the acceleration data is the acceleration of the user's head as they move, resulting in high quality acceleration data.

The method further includes detecting impact events using the acceleration data (516). As described in relation to FIG. 12, the contact time, flight time, and the like can be extracted given the acceleration data. The cadence of the user is then computed (518) and can be stored as steps per minute or the like. In some implementations, the cadence is computed without distinguishing right and left steps. The method also includes determining the speed of the user based on the cadence and the stride model (520). In some embodiments, the method optionally includes determining a distance traveled by the user based on the speed of the user (522).

Calibration of the wearable electronic device can be performed using one of several methods described herein. As an example, calibration can be performed by analyzing user stride data and user location data. For instance, the user stride data can be provided by an inertial motion unit in the wearable electronic device and the user location data can be provided by a location data unit in a device separate from the wearable electronic device, for example, a smart phone with GPS. Alternatively, in some embodiments in which the wearable electronic device includes components as illustrated in FIG. 3, an inertial motion unit in the wearable electronic device provides the user stride data and a location data unit in the wearable electronic device provides the user location data.

It should be appreciated that the specific steps illustrated in FIG. 5 provide a particular method of estimating a user's speed and distance traveled using an inertial motion unit according to an embodiment of the present invention. Other sequences of steps may also be performed according to alternative embodiments. For example, alternative embodiments of the present invention may perform the steps outlined above in a different order. Moreover, the individual steps illustrated in FIG. 5 may include multiple sub-steps that may be performed in various sequences as appropriate to the individual step. Furthermore, additional steps may be added or removed depending on the particular applications. One of ordinary skill in the art would recognize many variations, modifications, and alternatives.

FIG. 6A is a simplified flowchart illustrating a method of calibrating (e.g., performing initial calibration of) a wearable electronic device according to an embodiment of the present invention. This calibration process can be used to refine an initial model of the stride length for the user by measuring the user's location using a location data unit during a calibration process and correlating the user's location with the user's steps as described below.

As described herein, the stride length can be measured as a function of several variables, including the user's speed. Given the stride length, by counting steps as a function of time, the user's speed and distance run can be calculated. Some embodiments utilize an iterative process in which the user's speed and other variables are then used to update the calibration table. One of ordinary skill in the art would recognize many variations, modifications, and alternatives.

As an example, the wearable electronic device can be calibrated in accordance with the following procedure. The user initiates the activity with both an electronic location tracking device (e.g., a smart phone) and the inertial motion unit that is present as an element of the wearable electronic device. For example, the user can start a run carrying a smart phone in their pocket and wearing sports glasses including the inertial motion unit. An output element (e.g., a display) of the wearable electronic device can prompt the user to vary the speed of the run in a predetermined manner, for example, an increase in speed of a certain amount every 30 seconds. The speed of the user can be determined using the location data provided by the location data unit as a function of time. Feedback can be provided to the user through the wearable electronic device in real time or at selected intervals to inform the user of their speed in relation to the target speed. As the speed increases, the stride length vs. the speed is recorded. Accordingly, a curve of stride length vs. speed can be defined for the user over a range of speeds, for example, up to a maximum speed. For a given user, the stride length vs. speed curve will not change appreciably over time, providing for accurate measurement of speed based on the user's stride and cadence, which can be measured using the inertial motion unit independent of the location tracking device.

Referring to FIG. 6A, this method of calibration can be implemented by determining if a location data signal is locked (610), for example, a GPS signal from a smart phone that is separate from the wearable electronic device. If the location data signal is not locked, then a warning message may be generated (612) indicating that calibration cannot be completed. The method can then be terminated (626) or the process can be initiated again (605) until the signal is locked, thereby providing accurate location data for the user during the activity. Alternatively, the user can be prompted to calibrate the inertial motion unit on a track or other defined distance location (614) since by walking or running a known distance, the calibration can be performed.

Once the location data signal is locked (610), the maximum anaerobic speed (MAS) test is initiated by providing the user with a target speed for a first time period (e.g., 30 seconds) of an activity (620). As the user proceeds at the target speed, the location data is received (e.g., from the smart phone that the user is carrying) by the wearable electronic device (622). As the user continues to proceed at the target speed, the inertial motion unit provides user stride data (622). The user stride data is received concurrently with the location data in some embodiments and can include the stride value and the flight time ratio and the step cycle time for the current speed. In some embodiments, the contact time ratio and the step cycle time are utilized. As will be evident to one of skill in the art, given the contact time and the step cycle time, the flight time and flight time ratio can be computed. In alternative embodiments the flight time and the step cycle time are provided and the contact time and the contact time ratio and/or the flight time ratio are computed.

Figure 14:
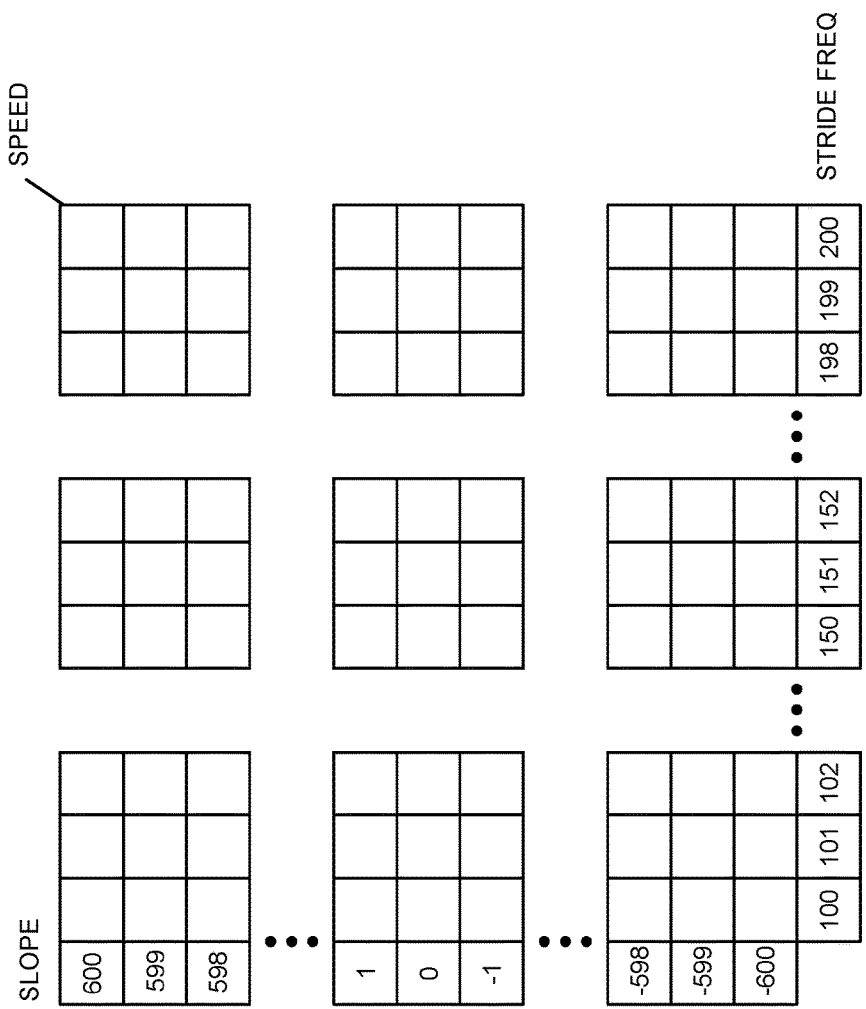
FIG. 14 is a calibration table for an inertial motion unit according to an embodiment of the present invention.

The user's speed as a function of the location of the user as a function of time is computed for the portion of the activity (624). Given the speed data and the user stride data, a calibration table is populated that lists the speed of the user as a function of the user stride data (625). As an example, the speed can be a function of the measured variables as illustrated in FIG. 14. As an example, the measured variables can include the stride length, the stride frequency, the elevation (e.g., the altitude above sea level) of the user during the activity, the slope of the ground during the relevant portion of the activity, the contact time, the contact time ratio, the flight time, the flight time ratio, impact force, subsets of this data, and the like.

The user is given the option to stop the recording (and populating the calibration table) (626) and the device is calibrated using the table (630). In some embodiments, the calibration table is stored and then accessed by the device during use to determine distance traveled and other parameters for the user's activity. Alternatively, the user can continue recording and increase the target speed for the next time period (628). As an example, for the next 30 seconds, the speed could be increased by 1 mile/hour and the user can be informed of this increase in the target speed. At this new speed, location data and the user stride data from the inertial motion unit are received for the current target speed (622) and the table is populated further (625) based on the speed computation (624). The process is repeated until the user has reached the MAS and terminates the method (626), thereby completing the calibration of the device in accordance with the populated table (630).

It should be appreciated that the specific steps illustrated in FIG. 6A provide a particular method of calibrating a wearable electronic device according to an embodiment of the present invention. Other sequences of steps may also be performed according to alternative embodiments. For example, alternative embodiments of the present invention may perform the steps outlined above in a different order. Moreover, the individual steps illustrated in FIG. 6A may include multiple sub-steps that may be performed in various sequences as appropriate to the individual step. Furthermore, additional steps may be added or removed depending on the particular applications. One of ordinary skill in the art would recognize many variations, modifications, and alternatives.

FIG. 6B is a simplified flowchart illustrating a method of calibrating a wearable electronic device according to an embodiment of the present invention. The method illustrated in FIG. 6B can be used to calibrate a wearable electronic device that includes an inertial motion unit and can work in conjunction with a separate device that includes a location data unit, for example, a smart phone including GPS. The method discussed in relation to FIG. 6B includes common elements shared with the method discussed in relation to FIG. 6A and the discussion provided in relation to FIG. 6A is applicable to FIG. 6B as appropriate.

The method includes initiating an activity by setting a target speed for a portion of an activity, which can be a calibration activity (650). The method also includes receiving a series of measurements related to a user's stride during the portion of the activity (652). Each of the series of measurements includes data associated with the user's stride. As an example, the data associated with the user's stride can include a contact time, a step cycle time, a flight time, a contact time ratio, and a flight time ratio. In addition to these parameters, each of the series of measurements can also include data associated with an elevation of the user as well as a slope of a portion of the activity location. In some embodiments, receiving the series of measurements related to the user's stride can also include receiving accelerometer data from an inertial motion unit.

The method also includes receiving a series of measurements of the user's position during the portion of the activity (654). In some implementations, the position measurements are received concurrently with the series of measurements related to the user's stride. In other embodiments, the position measurements can be stored on the remote device and received after the stride measurements and then used as described below.

The method further includes computing a speed of the user as a function of the user's position as a function of time (656). In some embodiments, the GPS location data is used to determine the user's speed as a function of time during each portion of the activity. Given the speed data, the method includes populating a table of the speed of the user as a function of the data associated with the user's stride (658). As an example, a table similar to the one illustrated in FIG. 14 can be populated so that calibration data for the wearable electronic device can be generated and stored (662).

As illustrated in FIG. 6B, the calibration table can be populated for several portions of the calibration activity. As an example, the target speed could vary over a range of speeds, for example, from low to high speeds. If the next portion is to be used, then the method can include receiving an indication to continue calibration, for example, from the user, and the target speed can be increased for the next portion (670). An indication can be provided to the user to indicate the new target speed (670) and the method iterates by continuing to 652. During the iteration, the new target speed is used in place of the initial target speed, enabling additional population of the calibration table. One of ordinary skill in the art would recognize many variations, modifications, and alternatives.

It should be appreciated that the specific steps illustrated in FIG. 6B provide a particular method of calibrating a wearable electronic device according to an embodiment of the present invention. Other sequences of steps may also be performed according to alternative embodiments. For example, alternative embodiments of the present invention may perform the steps outlined above in a different order. Moreover, the individual steps illustrated in FIG. 6B may include multiple sub-steps that may be performed in various sequences as appropriate to the individual step. Furthermore, additional steps may be added or removed depending on the particular applications. One of ordinary skill in the art would recognize many variations, modifications, and alternatives.

In alternative embodiments, the wearable electronic device illustrated in FIG. 4B can be calibrated by running or walking a prior known distance and allowing the device to calculate the athlete's current stride value. As discussed herein, the stride parameters, including contact time, flight time, stride frequency, and the like, can vary according to several parameters like degree of fatigue, nature of the track during calibration (e.g., soft or hard surface), slope of the track and the like. One of ordinary skill in the art would recognize many variations, modifications, and alternatives.

Figure 15:
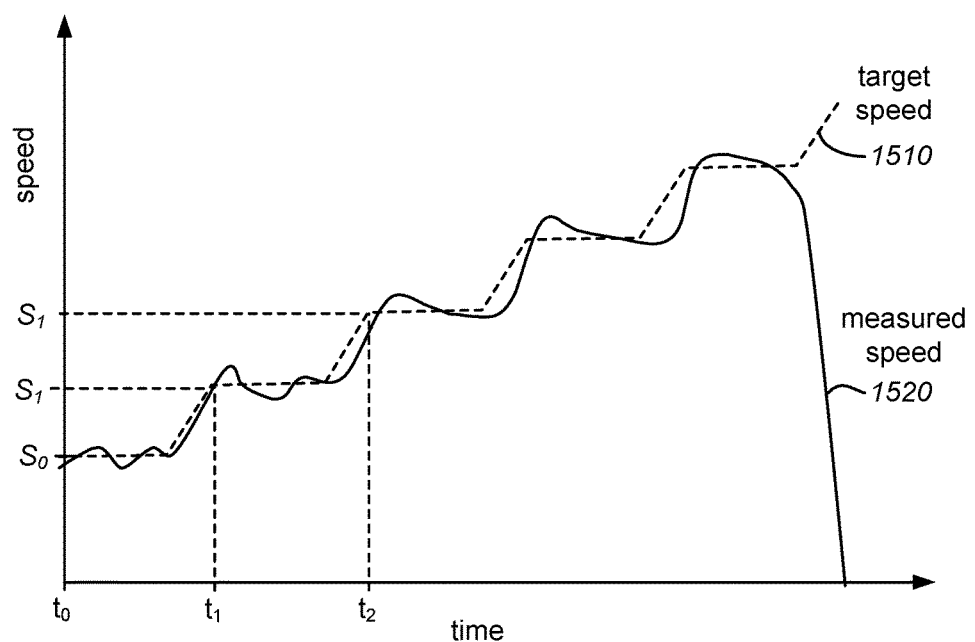
FIG. 15 is a plot illustrating measured speed vs. time for the calibration process illustrated in FIG. 6A.

FIG. 15 is a plot illustrating measured speed vs. time for the calibration process illustrated in FIGS. 6A and 6B. The target speed at each speed interval is illustrated as curve 1510. The speed of the user measured using the location data unit is illustrated as curve 1520. Speed $S_0$ is the initial speed as the MAS test begins at 620/650. At time $t_1$, the speed is increased to speed $S_1$ for the time interval that extends from time $t_1$ to time $t_2$. The cadence is measured and recorded as the user's speed stabilizes at each time interval. In addition to cadence, other variables can be measured and recorded, including contact time, flight time, contact time ratio, flight time ratio, and the like.

In addition to this calibration process, additional calibration processes can be performed and the calibration table updated for different conditions, including at different altitudes, different slopes (uphill, downhill), differing terrain types (e.g., rocky path, paved path etc.), and the like. Using the components of the inertial measurement unit, the presence of differing terrains can be determined based on the user's deviation from or adherence to a single direction, for example.

In some embodiments, during the user's activity, the calibration table is updated in real time using data from the inertial motion unit (which can include an atmospheric pressure sensor and a magnetometer) and the location data unit. The location data is utilized in conjunction with the inertial motion unit data to determine stride length in context, i.e., speed, slope, terrain type, etc., and the stride length table is updated to reflect accurate values or to refine values already present. When the location data is not accurate or not available (e.g., at the beginning of a run prior to the TTFF), the stride length extracted from the table can then be used given the current context to determine the user's speed and other characteristics of the activity. As another example, during interval training, the data from the inertial motion unit can override the data from the location data unit to compensate of the latency of the location data unit.

FIG. 7A is a simplified flowchart illustrating a method of updating calibration data for a wearable electronic device according to an embodiment of the present invention. Referring to FIG. 7A, the method includes starting exercise (710), which can include recording of data from the sensors. A determination is made if the location tracking data is available (e.g., if the GPS signal is locked) (712). The location data may not be available for several reasons, including prior to TTFF. The condition of not being available may include conditions in which the location signal is partially available, but not as accurate as desired, for example, when a number of GPS satellites are not in view, or the like.

If the location tracking data is not available, then a determination is made of whether the stride calibration has been completed (714). As discussed in relation to FIG. 5, the initial user profile can be used to provide an initial or improved speed vs. cadence curve, which can be used to determine the default stride calibration. The stride calibration is then completed using the location data unit as described below.

If both 712 and 714 are negative, the inertial motion unit can be utilized to provide speed/distance data using the default stride calibration as described below. A warning message can be generated and provided to the user indicating that the data accuracy is limited since neither the location data nor the calibrated stride data are available (718). As illustrated in FIG. 3, the processor 330 receives inputs from the inertial motion unit 320. In the absence of a GPS signal, the processor receives signals originating in the accelerometer 224 so as to serve as a pedometer. The accelerometer 224 provides an acceleration signal from which, in a manner known to one skilled in the art, the processor calculates the speed of the runner. By combining the speed of the runner with the time (e.g., a signal coming from the timer) the processor is able to calculate the distance covered by the runner.

This use of the inertial motion unit is particularly useful in case of failure of the location data unit (e.g., loss of the GPS signal) since the system can provide information on the distance covered by the user. Since the inertial motion unit can provide an indication of the steps made by the runner (e.g., steps per minute) it is possible to determine the distance between two consecutive steps based on a previous calibration that was recorded, thereby providing information despite the location information not being available.

If the stride calibration has been completed, then an optional warning message can be provided that the accuracy of the location data is not based on the location data provided by the location data system but only on the stride data provided by the inertial motion unit (716). Since the inertial motion unit provides speed/distance data, it is possible to extrapolate GPS coordinates that may have been previously available and thus the route followed (as shown on a map) by combining stride data (distance) and a magnetometer signal (direction).

In the embodiment illustrated in FIG. 7A, it is possible to decrease the energy consumption of the system by switching the location data unit on or off in a predetermined manner. As an example, the GPS signal can be switched off by sending an activation/deactivation signal to the GPS module in an on demand manner in response to a user input, periodically at predetermined time intervals, non-periodically in a given sequence, or the like. When the location data unit is switched off, the inertial motion unit provides inputs to the processor to track the user's distance traveled. When the location data unit is switched back on, providing the signal lock illustrated in 712, calibration can be performed to refine the speed/distance output provided by the inertial motion unit.

If the location tracking data is available at 712, then a determination is made of whether stride calibration has been completed (720). Calibration being completed can be considered as the updates to the calibration falling within a predetermined range. As the system operates to improve the calibration as discussed in relation to 730, the calibration will converge for the user and once the calibration converges to within a predetermined range, the calibration process can be considered complete. If the stride calibration is not complete, then an optional warning (722) can be generated that speed/distance data is being accumulated, but could be at a slow rate characterized by measurement latency. The information from the location data unit is then used to record/provide (e.g., display) data related to the activity (740).

If the stride calibration has been completed (720), then the information from the location data unit is used to improve the stride calibration based on the accurate location information that is available from the location data unit (730). Additional description related to populating and refining the calibration table is provided in relation to FIG. 13. The refinement of the calibration data can be used to replace or complement the data provided by the inertial motion unit. For instance, if the GPS signal was not available at the beginning of the activity, the inertial motion unit could provide the initial speed/distance data and the system could re-compute the total distance when a loop is completed by using GPS data in combination with the data from the inertial motion unit. In addition, during continuous calibration using GPS data, the altitude, slope, terrain, and other variables can be accounted for to improve the accuracy of the calibration table.

When the location data is available during use, it can be used to calibrate the stride length table accordingly to the context, allowing the stride value to be matched with the track conditions. As motion analysis and altimeter data allow for context identification (rest-walk-run, uphill-level-downhill), the accuracy of the calibration can be improved. As an example use case, the first time the user uses the system, for example, for a 10 mile run, the lack of GPS data at the beginning of the run and the default speed/cadence model could produce an output that the run was 9.5 miles in length. As the user subsequently uses the system, the improvements in the stride calibration will improve the accuracy, increasing the output value for subsequent runs until the 10 mile value is achieved.

If the activity is not completed (742), then the method loops back to the determination of whether location data is available (712). If the location tracking data is not available (712) and the stride calibration has not been performed (714), then an optional warning message can be provided that the accuracy of the data is low (718) before or in conjunction with the display of the data to the user (740). Since receipt of the location data will improve accuracy, conditions in which the stride calibration is not complete will typically only last during the initial phase of use of the system.

It should be appreciated that the specific steps illustrated in FIG. 7A provide a particular method of updating calibration data for a wearable electronic device according to an embodiment of the present invention. Other sequences of steps may also be performed according to alternative embodiments. For example, alternative embodiments of the present invention may perform the steps outlined above in a different order. Moreover, the individual steps illustrated in FIG. 7A may include multiple sub-steps that may be performed in various sequences as appropriate to the individual step. Furthermore, additional steps may be added or removed depending on the particular applications. One of ordinary skill in the art would recognize many variations, modifications, and alternatives.

FIG. 7B is a simplified flowchart illustrating a method of calibrating a wearable electronic device including a location data unit and an inertial motion unit according to an embodiment of the present invention. The method includes initiating a calibration process for the wearable electronic device (750) and providing a calibration table including default calibration data for the wearable electronic device (752). In some embodiments, the order of these elements can be reversed since the wearable electronic device can include a default calibration table as delivered. The calibration table can include user speed as function of slope and stride frequency. As an example, the default calibration data can include speed as a function of stride frequency for a default user or for a specific user.

The method also includes receiving, from the location data unit, location data associated with the wearable electronic device as a function of time (754) and receiving, from the inertial motion unit, user stride data as a function of time (756). In some embodiments, the location data and the user stride data are received concurrently. As examples, the user stride data can include a contact time, a step cycle time, and a contact time ratio. This data can further include a flight time and a flight time ratio. Given the location data, the method computes a travel speed of the wearable electronic device based on the location data (758). Given the travel speed and the user stride data, the calibration table is updated (760). Information associated with the calibration table can be provided to the user. As an example, providing information can include displaying the information to the user using a display or a set of LEDs, playing an audio signal associated with the calibration table, or the like.

In some embodiments, the calibration process can be continued (760), which can improve the quality of the data in the calibration table as the location data and user stride data are collected and analyzed in an iterative manner. For example, continuing the calibration process can include iteratively receiving location data as a function of time during a later stage of the calibration process (754) and receiving user stride data as a function of time at this later stage (756). Given the location data and the user stride data, the travel speed is computed (758) and the calibration table is updated (760). When the calibration process is no longer continued, for example, when the changes to the calibration table fall below a given threshold, then the calibration process is complete (762).

It should be appreciated that the specific steps illustrated in FIG. 7B provide a particular method of calibrating a wearable electronic device including a location data unit and an inertial motion unit according to an embodiment of the present invention. Other sequences of steps may also be performed according to alternative embodiments. For example, alternative embodiments of the present invention may perform the steps outlined above in a different order. Moreover, the individual steps illustrated in FIG. 7B may include multiple sub-steps that may be performed in various sequences as appropriate to the individual step. Furthermore, additional steps may be added or removed depending on the particular applications. One of ordinary skill in the art would recognize many variations, modifications, and alternatives.

Figure 7C:
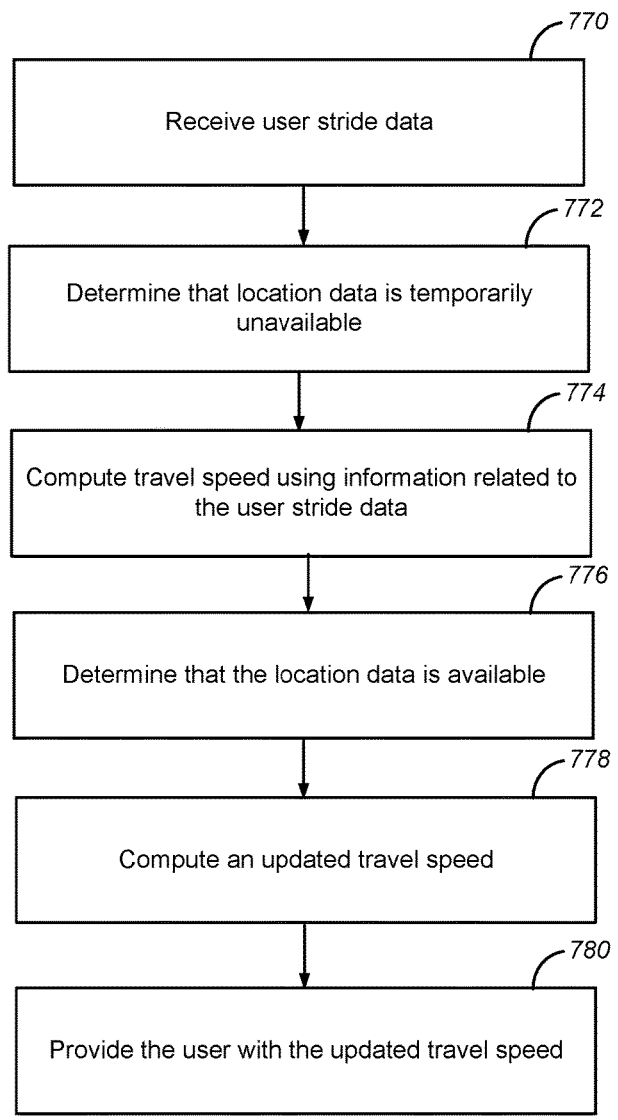
FIG. 7C is a simplified flowchart illustrating a method of determining travel speed of a user according to an embodiment of the present invention.

FIG. 7C is a simplified flowchart illustrating a method of determining travel speed of a user according to an embodiment of the present invention. The user is wearing a wearable electronic device including an inertial motion unit and a location data unit during implementation of the method. The method includes receiving, from the inertial motion unit of the wearable electronic device, user stride data (770). The method also includes determining that location data is temporarily unavailable from the location data unit (772). The location data can be temporarily unavailable during a time prior to a time to first fix (TTFF) for the location data unit. Alternatively, the location data can be available during an early portion of the activity and then become unavailable, for example, as a result of shadows cast by buildings. In this case in which the location data is initially available and then temporarily unavailable, the travel speed can initially be computed using both user stride data and location data, be computed using user stride data when the location data is unavailable, and computed again using both user stride data and location data when the location data is available again. Thus, the travel speed can be updated throughout the process depending on the data that is available.

The method also includes computing travel speed using information related to the user stride data (774) since the location data is unavailable. Thereafter, the method includes determining that the location data is available from the location data unit (776). As described above, the TTFF could have passed, the wearable electronic device could have emerged from a tunnel, or the like. Since the location data is now available, the method includes computing an updated travel speed using information related to the location data (778) and providing the user with the updated travel speed (780).

It should be appreciated that the specific steps illustrated in FIG. 7C provide a particular method of determining travel speed of a user according to an embodiment of the present invention. Other sequences of steps may also be performed according to alternative embodiments. For example, alternative embodiments of the present invention may perform the steps outlined above in a different order. Moreover, the individual steps illustrated in FIG. 7C may include multiple sub-steps that may be performed in various sequences as appropriate to the individual step. Furthermore, additional steps may be added or removed depending on the particular applications. One of ordinary skill in the art would recognize many variations, modifications, and alternatives.

Figure 7D:
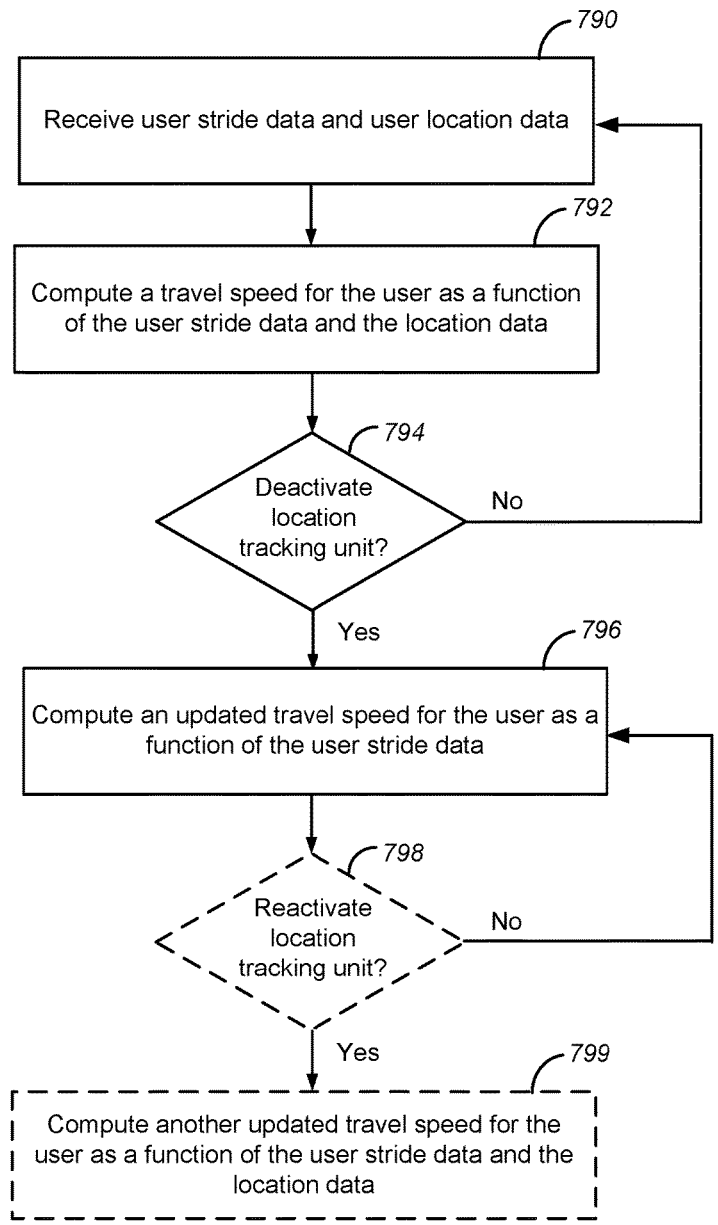
FIG. 7D is a simplified flowchart illustrating a method of conserving battery power for a wearable electronic device according to an embodiment of the present invention.

FIG. 7D is a simplified flowchart illustrating a method of conserving battery power for a wearable electronic device according to an embodiment of the present invention. The method includes receiving user stride data and user location data associated with the wearable electronic device (790). The user stride data can be generated using the inertial motion unit of the wearable electronic device and the user location data can be generated using the location data unit of the wearable electronic device.

The method also includes computing a travel speed for the user as a function of the user stride data and the location data (792). As discussed in relation to FIG. 13, the combination of user stride data and user location data can provide information useful in calibrating a user-specific table characterizing the user's stride/speed as a function of a number of variables.

The method further includes deactivating the location data unit (794). In some embodiments, the method includes receiving an indication to deactivate the location data unit of the wearable electronic device prior to the deactivation. The indication to deactivate the location data unit can be associated with a battery level of the wearable electronic device. As an example, in order to save battery power, the user could provide an instruction to deactivate the location data unit. Alternatively, the power level of the battery could be monitored and a processor could provide an instruction (e.g. an automatic instruction) to deactivate the location data unit when the battery power drops below a threshold value. In yet another implementation, the indication to deactivate the location data unit could be provided periodically once the calibration table has been updated to an acceptable level. One of ordinary skill in the art would recognize many variations, modifications, and alternatives.

The method includes computing an updated travel speed for the user as a function of the user stride data (796). Since the location data unit has been deactivated, the inertial motion unit can provide the stride data at low power while still achieving acceptable speed/stride accuracy. In some embodiments, the method further includes providing the user with the travel speed and the updated travel speed.

In an optional process, the method further includes, after computing the updated travel speed, receiving an indication to reactivate the location data unit of the wearable electronic device and reactivating the location data unit (798). The reactivation, similar to the deactivation, can be performed in response to user input, in response to a battery level, on a periodic basis, or the like. Once the location data unit is reactivated, new user location data can be received and another updated travel speed can be computed for the user as a function of the user stride data and the new user location data (799). In this case, the user can be provided with the another updated travel speed.

It should be appreciated that the specific steps illustrated in FIG. 7D provide a particular method of conserving battery power for a wearable electronic device according to an embodiment of the present invention. Other sequences of steps may also be performed according to alternative embodiments. For example, alternative embodiments of the present invention may perform the steps outlined above in a different order. Moreover, the individual steps illustrated in FIG. 7D may include multiple sub-steps that may be performed in various sequences as appropriate to the individual step. Furthermore, additional steps may be added or removed depending on the particular applications. One of ordinary skill in the art would recognize many variations, modifications, and alternatives.

Figure 8A:
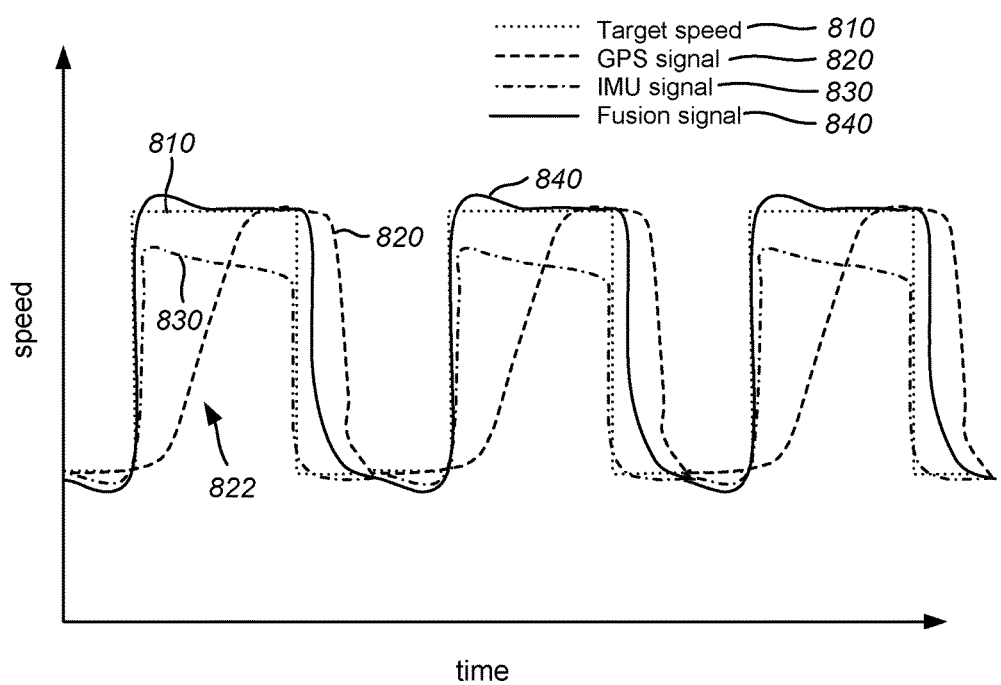
FIG. 8A is a plot illustrating fusion of inertial motion unit data and location data unit data according to an embodiment of the present invention.

FIG. 8A is a plot illustrating fusion of inertial motion unit data and location data unit data according to an embodiment of the present invention. In FIG. 8A, curve 810 represents the target speed during an interval training routine, curve 820 represents the location data unit data during the training routine, curve 830 represents the inertial motion unit data during the training routine, and curve 840 represents the fusion of the inertial motion unit data and the location data unit data.

Referring to FIG. 8A, during interval training, the runner alternates between periods of high and low speeds, i.e., high intensity periods and low-intensity periods. Such intervals can be as short as few tens of seconds to several minutes. When intervals are short, the location data reacts slowly to the change in speed as illustrated by the slow rise 822 in the location data unit data 820 when the target speed increases rapidly. In contrast, the inertial motion unit data 830 tracks closely with the target speed at the beginning of the interval, indicating that the runner has increased the speed as desired. A similar effect is observed at the end of the high speed interval, when the location data unit data lags significantly whereas the inertial motion unit data tracks closely as the speed decreases to the low speed level.

During the middle and the end of the high speed interval, the speed stabilizes at the target speed and the location data unit data provides an accurate measure of the runner's speed at the end of the high speed portion of the interval. Accordingly, the fusion signal 840 utilizes the inertial motion unit data during the initial phase of the interval and then transitions to the location data unit data during the middle phase of the interval. At the end of the interval, the inertial motion unit data is utilized to determine the end of the interval. As discussed herein, the inertial motion unit data can be utilized to compensate for errors in the location data unit data or absence of the location data unit data in a similar manner to the interval training example illustrated in FIG. 8A, for example, in the case of loss of the GPS signal.

Figure 8B:
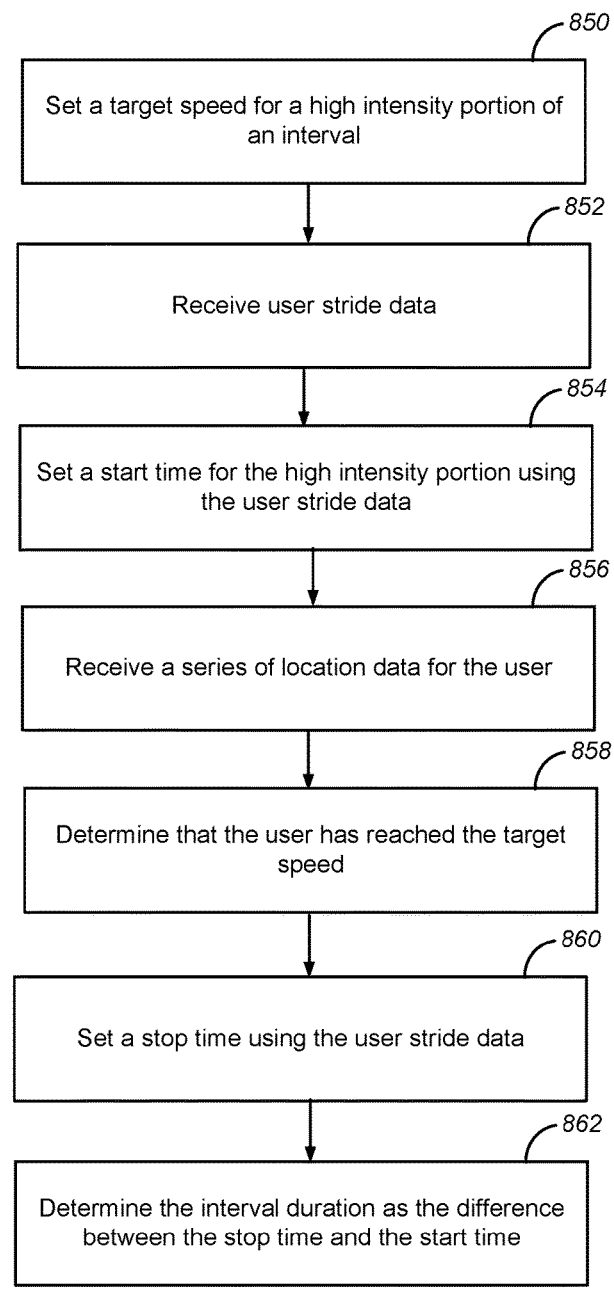
FIG. 8B is a simplified flowchart illustrating a method of determining interval duration for a user during interval training according to an embodiment of the present invention.

FIG. 8B is a simplified flowchart illustrating a method of determining interval duration for a user during interval training according to an embodiment of the present invention. The method is performed in conjunction with a wearable electronic device that includes an inertial motion unit and a location data unit. The method includes setting a target speed for the user during a high intensity portion of interval training (850) and receiving, from the inertial motion unit of the wearable electronic device, user stride data (852). During the initial portion of the high intensity part of the interval, the location data lags as illustrated by slow rise 822 in FIG. 8A. Therefore, although the series of location data collected over time indicate that the user is increasing their speed as the speed based on location data increases, this slow rise in speed is due to lag in the location data and does not actually represent the speed of the user.

Accordingly, the start time for the high intensity portion is set using the user stride data (854). As the interval progresses, the location data, which is received from the location data unit, includes a series of location data for the user (856). The location data can be received throughout the interval and will include data points for the locations as the user moves during the interval. Thus, although 856 follows 852 in FIG. 8B, this is not required by the present invention and both user stride data and location data can be received throughout the interval.

As the location data experiences reduced lag as the high intensity portion of the interval progresses, the speed determined using the location data will stabilize, enabling the determination, based on the series of location data, that the user has reached the target speed (858). As an example, determining that the user has reached the target speed can include determining that a variation in the user speed is less than a predetermined threshold as illustrated in the late stages of the interval illustrated in FIG. 8A. In other embodiments, the measured speed and the target speed are compared and when the difference decreases below a threshold, the determination is made that the target speed has been reached.

The method further includes setting a stop time for the high intensity portion using the user stride data (860) and determining the interval duration as equal to the difference between the stop time and the start time (862). Referring to FIG. 8A, the user stride data tracks closely with the target speed at the onset and the completion of the high intensity portion. Accordingly, the user stride data is used to define the stop and start times while the location data, which may predict speed more accurately than achieved using the user stride data, can be used to determine the speed of the user during the interval. Given the interval duration and speed, the distance covered by the user and the speed of the user during the intervals can be accurately measured and reported to the user.

It should be appreciated that the specific steps illustrated in FIG. 8B provide a particular method of determining interval duration for a user during interval training according to an embodiment of the present invention. Other sequences of steps may also be performed according to alternative embodiments. For example, alternative embodiments of the present invention may perform the steps outlined above in a different order. Moreover, the individual steps illustrated in FIG. 8B may include multiple sub-steps that may be performed in various sequences as appropriate to the individual step. Furthermore, additional steps may be added or removed depending on the particular applications. One of ordinary skill in the art would recognize many variations, modifications, and alternatives.

Figure 13:
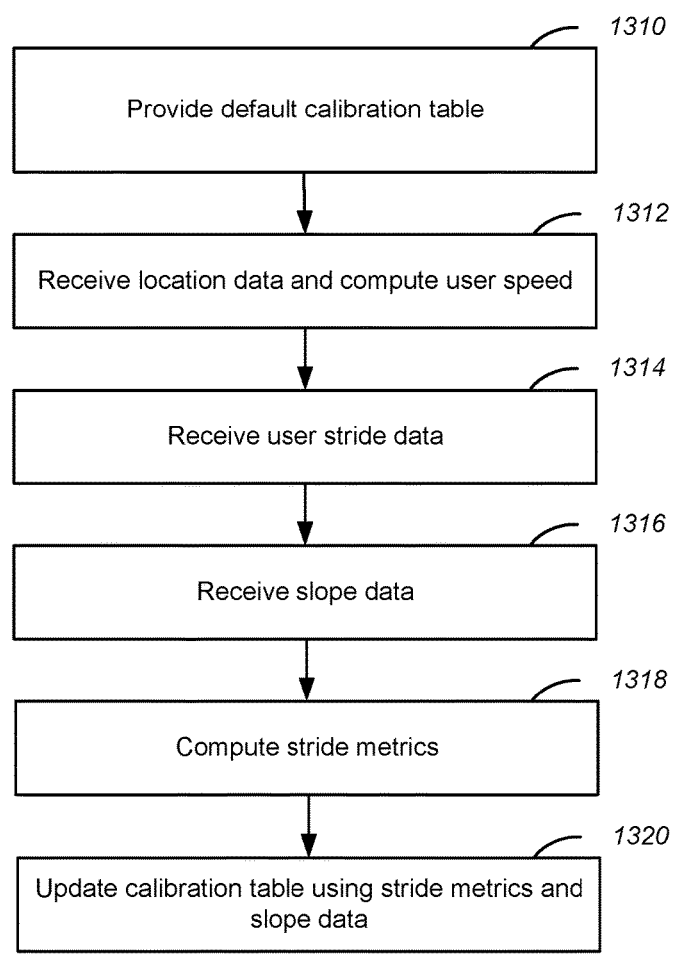
FIG. 13 is a simplified flowchart illustrating a method of updating a calibration table according to an embodiment of the present invention.

FIG. 13 is a simplified flowchart illustrating a method of updating a calibration table for a wearable electronic device according to an embodiment of the present invention. The wearable electronic device includes a location data unit (e.g., a GPS location unit) and an inertial motion unit, for example, as illustrated in FIG. 4A.

The method includes providing a default calibration table that includes default calibration data for the user (1310). The default calibration data can be generic, customized to the user based on gender and height, additional demographic information related to the user that places the user in a sub-group of the population, or the like. The method also includes receiving, from the location data unit, location data associated with the wearable electronic device as a function of time and computing a travel speed of the user based on the location data (1312). In some implementations, the location data unit is able to generate not only location data, but the travel speed data as well, enabling only speed data to be received from the location data unit.

The method further includes receiving, from the inertial motion unit, user stride data as a function of time (1314) and slope data (1316). The user stride data can be based on outputs of the accelerometer and the slope data can be based on outputs of the atmospheric pressure sensor, both of which are included in the inertial motion unit. As an example, stride frequency can be provided as user stride data. Given the user stride data, the processor computes stride metrics (1318). The stride metrics can include contact time ratio, flight time ratio, stride frequency, and the other metrics discussed in relation to FIG. 12. As will be evident to one of skill in the art, depending on the output of the inertial motion unit, user stride data and/or stride metrics may be provided or computed. One of ordinary skill in the art would recognize many variations, modifications, and alternatives.

The travel speed and the stride metrics are then used to update the calibration table (1320). In some embodiments, the data from the updated calibration table is provided to the user, for example, is displayed to the user. The updating of the calibration table can include populating travel speed fields as a function of stride frequency and slope data as illustrated in FIG. 14. In other embodiments, computational models are built similar to those illustrated in FIG. 11 to provide a multi-dimensional model of the user's travel speed as a function of the illustrated variables. Therefore, the table illustrated in FIG. 14 is merely exemplary and embodiments of the present invention are not limited to this implementation, but can incorporate other methods of mapping the user's stride to their speed.

It should be appreciated that the specific steps illustrated in FIG. 13 provide a particular method of updating a calibration table for a wearable electronic device according to an embodiment of the present invention. Other sequences of steps may also be performed according to alternative embodiments. For example, alternative embodiments of the present invention may perform the steps outlined above in a different order. Moreover, the individual steps illustrated in FIG. 13 may include multiple sub-steps that may be performed in various sequences as appropriate to the individual step. Furthermore, additional steps may be added or removed depending on the particular applications. One of ordinary skill in the art would recognize many variations, modifications, and alternatives.

In summary, as discussed above and illustrated in FIG. 13, embodiments of the present invention provide methods for populating a calibration table. The methods provide a way of improving the calibration table values using sensor data. The methods include receiving speed data from the location data unit and stride data (e.g., stride frequency) from the inertial motion unit that are integrated in the wearable electronic device. Data used during the calibration can include the flight time ratio that is computed based on data received from the accelerometer of the inertial motion unit and the slope variation from the pressure sensor. The flight time ratio data enables the system to improve the accuracy of the speed when low stride frequencies are measured.

Using this data, the user's speed as a function of the received variables is computed and the speed value is populated in the calibration table as a function of the independent variables. As illustrated in FIG. 14, in an embodiment, the speed is a function of the stride frequency and the slope, but higher dimension tables are included within the scope of the present invention as additional independent variables, including altitude, are utilized. One of ordinary skill in the art would recognize many variations, modifications, and alternatives.

FIG. 14 is a calibration table for an inertial motion unit according to an embodiment of the present invention. As illustrated in FIG. 14, the speed is the dependent variable, with slope, and stride frequency as the independent variables. Other independent variables can be included such as stride length, cadence, flight time, contact time, flight time ratio, impact force, and the like. As will be evident to one of skill in the art, the dependent and independent variables can be switched while still implementing the methods described herein.

The calibration table will be filled and updated as data are made available, providing a user-dependent calibration that improves over time to match the user's characteristics. As a result, highly accurate speed estimation is provided by embodiments of the present invention.

Triggering a Function Using Head Movements

Some conventional wearable electronic devices require complex interactions requiring users to stop or interrupt what they are doing to set the electronic device to a desired setting. For instance, a user may have to press a button on a watch or wristband to start a timer. In other devices, a user may have to physically access a user-interface to begin a recording on a wearable recording device. This can be very distracting and, in some cases, may not be possible. For example, a user may want to control a helmet mounted device while driving a motorized vehicle.

Thus, certain embodiments of the invention are directed towards hands-free user-interface to trigger one or more functions on a head-mounted electronic device. More specifically, head gestures can be detected by a head-mounted electronic device (e.g., via gyroscope, accelerometer, etc.) where certain specific movements (e.g., head tilts) can be used to trigger functions without requiring a user to physically touch a user interface. Some triggered functions include, but are not limited to, turning on a heads-up display, starting/stopping a timer, starting/stopping an audio and/or video recording, launching an application, activating or deactivating certain functions like an on-board GPS, communication block, power saving feature, or any other suitable function(s) controlled by or associated with the head-mounted electronic device. The triggering operation (movement) can be selected such that it is not normally performed naturally, which can reduce the chance of a false positive trigger. Some specific movements are further discussed below with respect to FIG. 17A.

Figure 16:
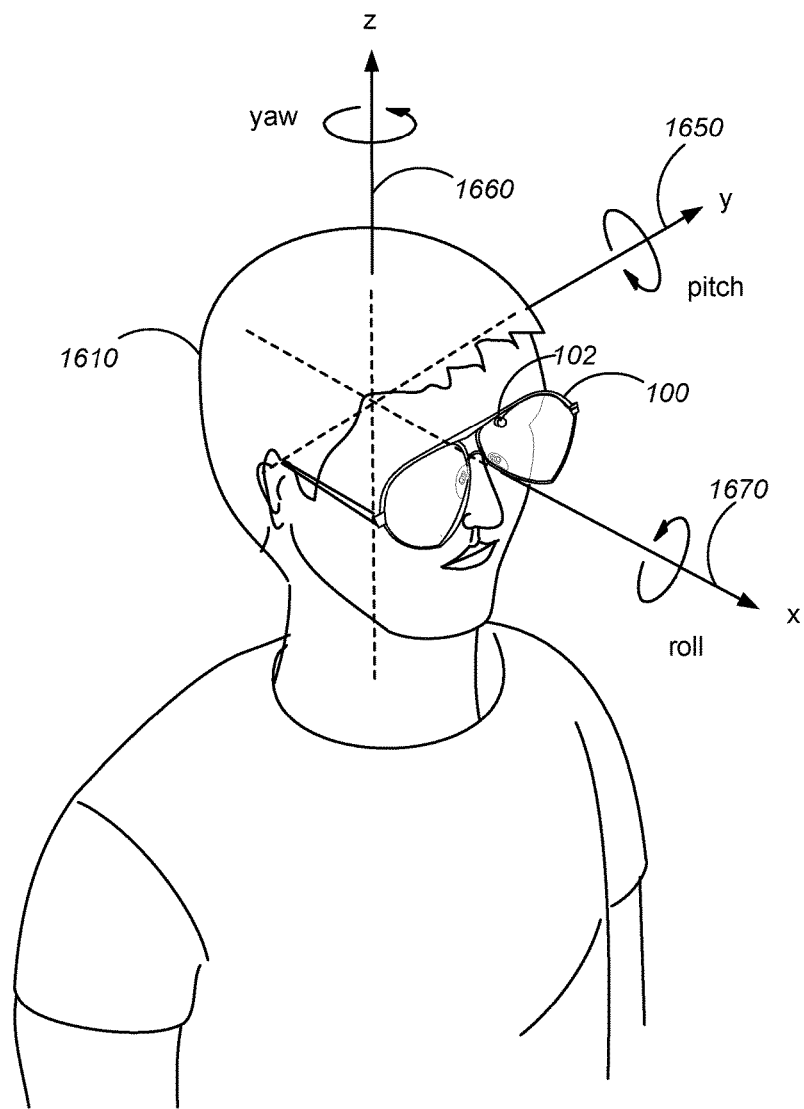
FIG. 16 shows a user wearing a head-mounted electronic device, according to an embodiment of the invention.

FIG. 16 shows a user 1610 wearing a head-mounted electronic device 100 implemented in a form factor of a pair of eye glasses, which includes a micro-projection component 102 and control component 103 (not shown) for projecting an image that is viewable to the user's eye, as shown in FIG. 1. In some embodiments, the various electronic components of head-mounted electronic device 100 can be integrated in any suitable head-mounted apparatus including, but not limited to, eye wear (e.g., glasses, goggles, etc.), hats, visors, helmets (see, e.g., FIG. 17C), ear pieces (with an arm to bring the micro-projection component to the user's eye), or the like. As mentioned above, micro-projection component 102 can display information to the user in any suitable format (e.g., heads up display). Audio and/or haptic output capabilities and memory resources (e.g., for recording) may be integrated into head-mounted electronic device 100.

Referring back to FIG. 16, a user 1610 is shown wearing electronic device 100 with three principal axis of rotation superimposed thereon, including pitch 1650, yaw 1660, and roll 1670. Pitch (i.e., lateral or transverse axis) passes through the plane from ear to ear. Changes in pitch move the user's head up and down. A positive pitch angle raises the user's face upwards, and a negative pitch lowers the user's face downwards.

Yaw is a vertical axis that is defined to be perpendicular to the line between the ears with its origin at the center of the user's head and directed straight down toward the user's feet. Yaw moves the persons head from side to side. A positive yaw moves the head to the right. A negative yaw moves the head to the left. That is, yaw based movements are lateral turning movements of the head with no tilt.

Roll is a longitudinal axis that passes through the user's head from nose to the back of the head. A positive roll angle tilts the head to the right. A negative roll angle tilts the head to the left. That is, roll based movements tilt the head left or right without causing the head to laterally turn (i.e., the head remains facing forward through roll movement).

Figure 17A:
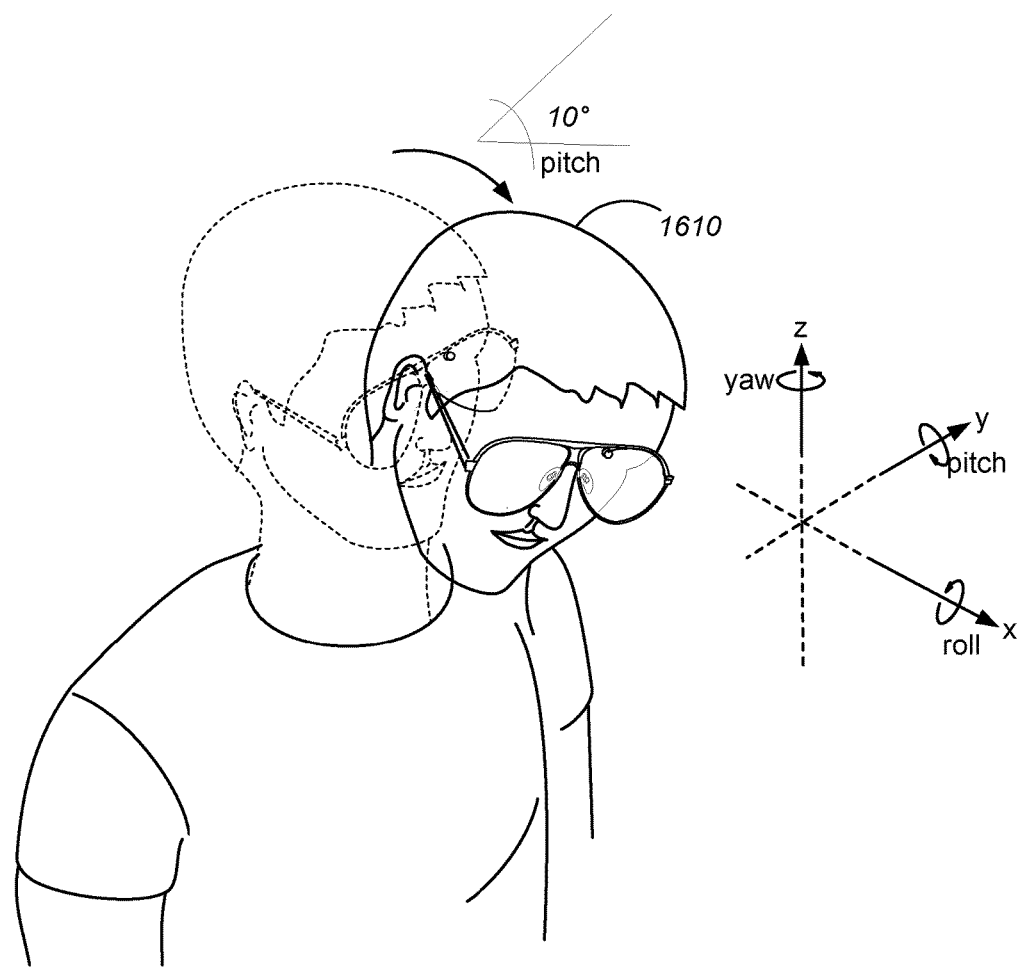
FIG. 17A shows a user performing a triggering operation on a head-mounted electronic device, according to an embodiment of the invention.

FIG. 17A shows a user 1610 performing a triggering operation on a head-mounted electronic device, according to certain embodiments of the invention. A triggering operation can occur in response to one or more specific head movements made by the user. Preferably, the specific head movement(s) do not commonly occur to minimize any false positive triggering operations. For instance, natural movements typically involve movements in two or three axes of rotation (e.g., pitch, yaw, roll). Therefore, some embodiments perform a triggering operation in response to a user moving his head (and thus the head-mounted electronic device) in a single axis of rotation.

In some embodiments, a trigger operation is detected when the user pitches his head straight forward (i.e., single axis of rotation) beyond a predetermined threshold angle. That is, the movement includes a negative pitch rotation with negligible yaw (left/right head turns) or roll (left/right head tilts) movements. In practice, it may be difficult to perform movements in exactly one axis of rotation, thus certain tolerances may be allowed. For instance, the yaw and/or roll movements that are less than +/−1 degree of rotation may be processed as no movement conditions in their respective axes. Any suitable "no movement" or "zero" threshold angle can be used (e.g., +/−0.5°, +/−1.5°, +/−2°, +/−3°, etc.). "No movement" thresholds may be symmetrical (e.g., +/−1°) or asymmetrical (e.g., +1° and)−1.5°. It should be noted that while smaller threshold angles may reduce false positive triggers (inadvertent triggers made by a user), it may increase the difficulty for users to consistently and reliably perform a trigger operation.

Referring back to FIG. 17A, a user performs a trigger operation by moving his head in a single axis (i.e., negative pitch) beyond a predetermined angle of 10°, with no appreciable yaw or roll movements (e.g., less than 1° of movement). A natural range of motion for head pitch can be +/−25°. In FIG. 17A, the predetermined threshold angle for triggering an operation is 10°, although any suitable angle may be used (e.g., 9°, 11°, 12°, 15°, etc.). Alternatively, a trigger operation can occur in response to single axis movement involving a negative pitch, a positive or negative yaw, or a positive or negative roll. For instance, a triggering operation may occur in response to a single-axis positive yaw of 75°. The natural range of motion of a user's head for a single-axis yaw or roll movement would be known by one of ordinary skill in the art, as well as a suitable corresponding predetermined threshold angle. In some embodiments, multiple movements may be required to perform a trigger operation. For example, a trigger operation may require a user to pitch their head forward beyond a predetermined angle and then pitch their head backwards by the same amount. Such single-axis multi-movement triggers may have symmetrical or asymmetrical threshold angle requirements (e.g., 10° pitch forward and 8° pitch backwards).

As mentioned above, limiting a triggering operation to single-axis movements can eliminate most false triggering conditions. However, some situations may occur where a user might perform a single-axis movement without intending to perform a trigger operation. For instance, a false positive trigger operation may occur in response to a user running down a steep hill or walking down a flight of steps since the user's head may be pitched downwards beyond the predetermined threshold to see where they are going. Thus, certain embodiments include a timing element used in conjunction with a single-axis movement to perform a trigger operation. For instance, some embodiments may require a pitch movement beyond the predetermined threshold to occur within a predetermined time period (e.g., within 1 second). Any suitable time period can be used. Faster time periods (e.g., <1 sec) can reduce the number of false positive trigger operations. More time may be allowed for trigger operations requiring multiple movements. Symmetrical and asymmetrical timings may be employed for multiple movements (e.g., 1 sec for a positive pitch greater than a predetermined angle, and 0.5 sec for a negative pitch). In some implementations, the predetermined threshold angle is measured relative to a static reference (e.g., 0° horizon). Alternatively, the predetermined threshold can be measured relative to a starting point. This can eliminate false positive trigger operations that may occur when a user is on a pitched surface. For example, if a user is walking down a steep pathway with his head already at set at a negative pitch, a trigger operation may only occur in response to a pitch movement at or beyond the predetermined threshold relative to the starting pitch. This can be supplemented with a timing measurement, or any of the myriad solutions and permutations addressed above.

In some embodiments, rotational movement can be measured by a gyroscope. Timing can be measured by a processor or other suitable time measuring device. Alternatively, timing can be indirectly measured by an accelerometer, as acceleration is a measurement of a change in velocity with respect to time, as would be appreciated by one of ordinary skill in the art.

Figure 17B:
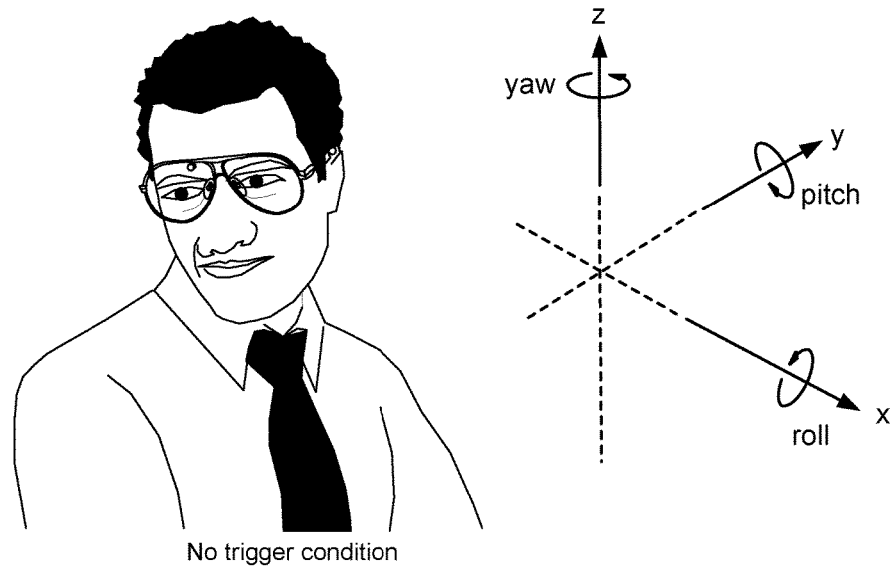
FIG. 17B shows an example of a no-trigger operation on a head-mounted electronic device, according to an embodiment of the invention.

FIG. 17B shows an example of a no-trigger operation on a head-mounted electronic device, according to certain embodiments of the invention. The user is shown diverting his attention to the side. The movement involves three axes of rotation including the head turning to the right (negative yaw), tilting to the right (positive roll), and some downwards movement (positive pitch). Thus, no trigger operation is detected because the pitch rotation is less than the predetermined threshold angle and the yaw and roll rotations are greater than the zero threshold angle, as discussed above. The user is shown wearing head-mounted electronic device 100. It should be understood that the concepts described herein and throughout this application can be applied to a head-mounted electronic device having any suitable form factor.

Figure 17C:
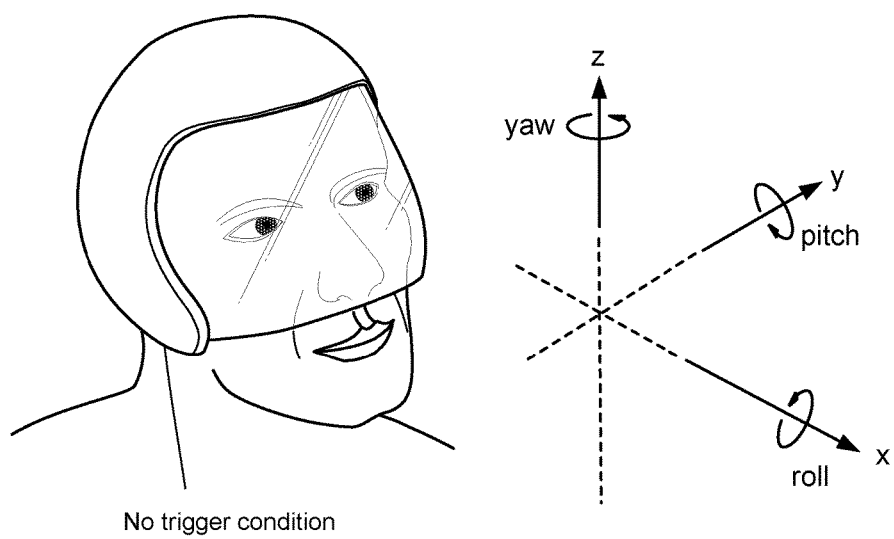
FIG. 17C shows a second example of a no-trigger operation on a head-mounted electronic device, according to an embodiment of the invention.

FIG. 17C shows a second example of a no-trigger operation on a head-mounted electronic device, according to certain embodiments of the invention. The user is shown diverting his attention to the side. The movement involves at least two axes of rotation with the user moving his head to the left (positive yaw), very little head tilt (positive roll), and some movement in pitch. In this example, a no trigger operation is detected because the pitch rotation is less than the predetermined threshold angle and the yaw rotation is greater than the zero threshold angle, as discussed above. The roll may be negligible (i.e., below the zero threshold angle), but it does not affect change the no-trigger condition. The user is shown wearing head-mounted electronic device with a form factor of a helmet.

Figure 18:
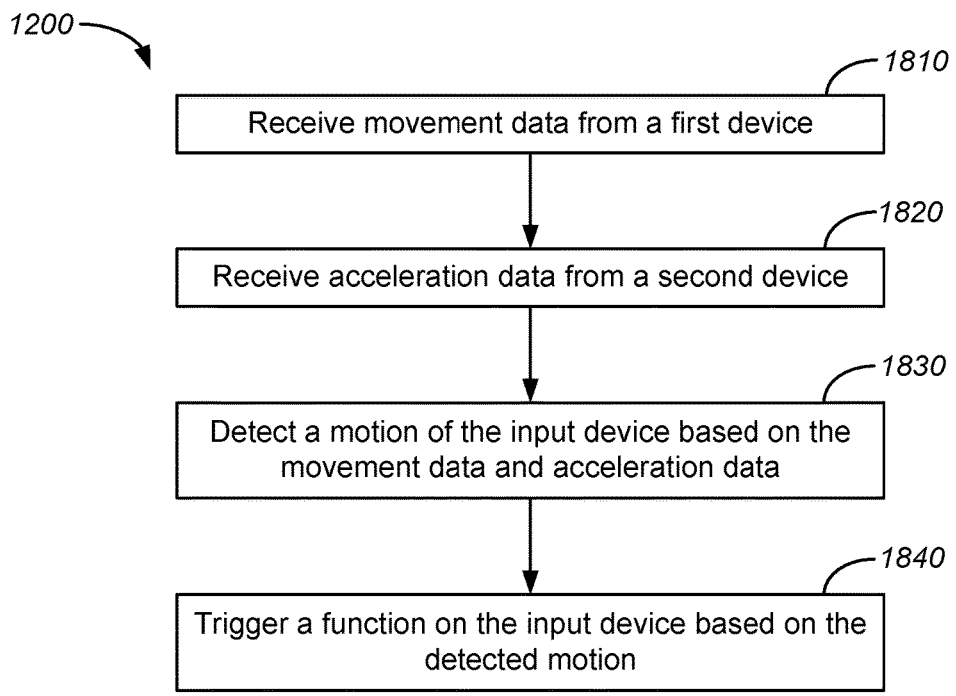
FIG. 18 depicts a simplified flow diagram illustrating aspects of a method of triggering a function on a head-mounted electronic device, according to an embodiment of the invention.

FIG. 18 depicts a simplified flow diagram illustrating aspects of a method 1800 of triggering a function on a head-mounted electronic device, according to certain embodiments of the invention. Method 1800 is performed by processing logic that may comprise hardware (e.g., circuitry, dedicate logic, processors, accelerometers, gyroscopes, etc.), software (which is run on a general purpose computing system or a dedicated machine), firmware (embedded software), or any combination thereof. In one embodiment, method 1800 is performed by control component 1910 of FIG. 19.

Referring to FIG. 18, method 1800 begins with receiving movement data from a first device corresponding to a movement of an input device (step 1810). The movement data can include pitch movement data, yaw movement data, and roll movement data. Movement data can include displacement data, rotational data, or both. The first device can be a gyroscope or other suitable device that can measure an orientation and/or movement of the input device.

Step 1820 includes receiving acceleration data from a second device corresponding to an acceleration of the input device. The second device can be an accelerometer or any suitable device(s) that can directly or indirectly measure an acceleration of the input device. Both the first and second devices may be disposed in the input device. The head-mounted input device may be eyewear, headwear (e.g., helmet, visor, hat, etc.), or other head-mounted form factor.

Step 1830 includes detecting a motion of the input device from a reference position based on the movement data and acceleration data. The reference position can be an absolute reference position (e.g., zero degrees in pitch, yaw, and/or roll), a previous position (e.g., an orientation measured immediately prior to movement, or the like. The motion can be defined by a pitch movement from the reference position that exceeds a first predetermined movement threshold value, a yaw movement from the reference position that is below a second predetermined movement threshold value, and a roll movement from the reference position that is below a third predetermined movement threshold value. In some embodiments, the first predetermined movement threshold value can be 10°, although other thresholds can be used as discussed above. The second and third predetermined movement threshold values (also referred to as a "no movement" or "zero" threshold angle) can be any suitable value. The second and third predetermined threshold values can be equal or different in magnitude and/or direction.

In some cases, detecting a motion of the input device further includes detecting that the pitch movement has an acceleration greater than a predetermined acceleration threshold value. This can be measured in velocity or in time. For instance, the predetermined acceleration threshold value may be 1 second. That is, the pitch movement has to meet or exceed the first predetermined movement threshold value within 1 second, or other suitable time frame, as further discussed above.

In some embodiments, the pitch movement can be a first pitch movement, where the motion is further defined by a second pitch movement opposite in direction from the first pitch movement that exceeds the first predetermined movement threshold value. For example, a user may be required pitch his head forward and back again according to their corresponding predetermined threshold angles.

Step 1840 includes triggering a function on the input device in response to detecting the motion. One or more functions on the input device or associated with the input device can be triggered. Some examples of triggered functions can include turning on a heads-up display, starting/stopping a timer, starting/stopping an audio and/or video recording, launching an application, activating or deactivating certain functions like an on-board GPS, communication block, power saving feature, toggling functions on/off, placing a flag on a route in a map application, or any other suitable function(s) controlled by or associated with the head-mounted electronic device.

It should be appreciated that the specific steps illustrated in FIG. 18 provide a particular method of triggering a function on a head-mounted input device, according to an embodiment of the present invention. Other sequences of steps may also be performed according to alternative embodiments. For instance, in some embodiments, individual steps can be performed in a different order, at the same time, or any other sequence for a particular application, as noted above. Moreover, the individual steps illustrated in FIG. 18 may include multiple sub-steps that may be performed in various sequences as appropriate to the individual step. Furthermore, additional steps may be added or removed depending on the particular applications. The various electronics, hardware, software, etc., used to implement the method can vary, as further described elsewhere. One of ordinary skill in the art would recognize and appreciate many variations, modifications, and alternatives of the method.

Figure 19:
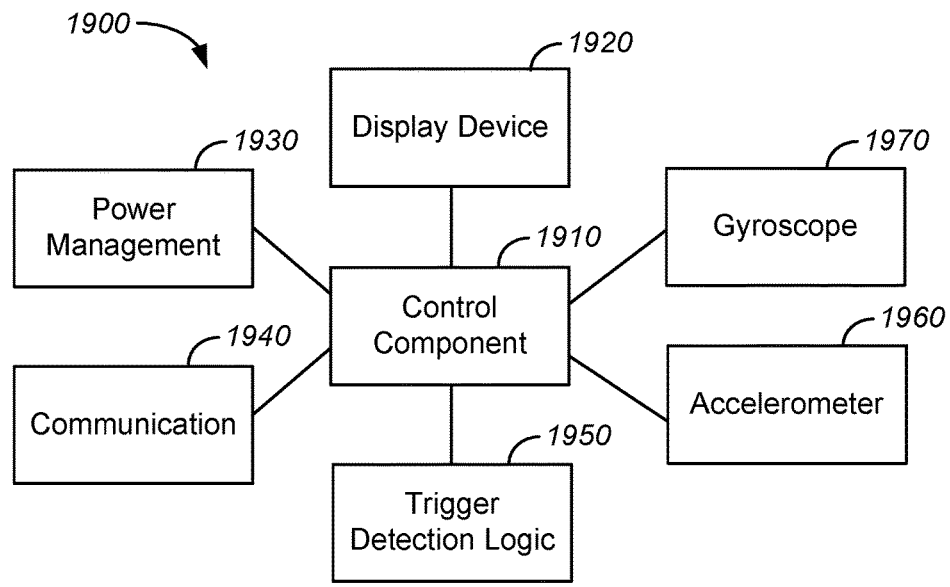
FIG. 19 is a simplified block diagram of a system configured to operate head-mounted input device, according to an embodiment of the invention.

FIG. 19 is a simplified block diagram of a system 1900 configured to operate a wearable electronic device 100, which can also be referred to as a head-mounted input device or an input device, according to an embodiment of the invention. System 1900 includes control component 1910, display device 1920, power management system 1930, communication system 1940, trigger detection logic 1950, accelerometer(s) 1960, and gyroscope(s) 1970. Each of the system blocks 1920-1970 can be in electrical communication with the control component 1910. System 1900 may further include additional systems that are not shown or discussed to prevent obfuscation of the novel features described herein.

In certain embodiments, control component 1910 comprises one or more microprocessors (μCs) and can be configured to control the operation of system 1900. Alternatively, control component 1910 may include one or more microcontrollers (MCUs), digital signal processors (DSPs), or the like, with supporting hardware and/or firmware (e.g., memory, programmable I/Os, etc.), as would be appreciated by one of ordinary skill in the art with the benefit of this disclosure. Alternatively, MCUs, μCs, DSPs, ASICs, FPGAs, and the like, may be configured in other system blocks of system 1900. For example, trigger detection logic block 1950 may include a local processor to process trigger detection. In some embodiments, multiple processors may provide an increased performance in system 1900 speed and bandwidth. It should be noted that although multiple processors may improve system 1900 performance, they are not required for standard operation of the embodiments described herein.

Display device 1920 can display images generated by electronic device 100. Display device 1920 can include various image generation technologies, e.g., liquid crystal display (LCD), light emitting diode (LED) including organic light emitting diodes (OLED), projection system, or the like, together with supporting electronics (e.g., digital-to-analog or analog-to-digital converters, signal processors, or the like), indicator lights, speakers, tactile "display" devices, headphone jacks, and so on.

Power management system 1930 can be configured to manage power distribution, recharging, power efficiency, and the like, for input device 100. In some embodiments, power management system 1930 can include a battery (not shown), a USB based recharging system for the battery (not shown), power management devices (e.g., low-dropout voltage regulators—not shown), and a power grid within system 1900 to provide power to each subsystem (e.g., accelerometers 1970, gyroscopes 1960, etc.). In certain embodiments, the functions provided by power management system 1930 may be incorporated into the control component 1910.

Communications system 1940 can be configured to provide wireless communication with other devices and/or peripherals, according to certain embodiment of the invention. Communications system 1940 can be configured to provide radio-frequency (RF), Bluetooth, infra-red, or other suitable communication technology to communicate with other wireless devices. System 1940 may optionally comprise a hardwired connection to a computing device. For example, input device 100 can be configured to receive a Universal Serial Bus (USB) cable to enable bi-directional electronic communication with a computing device or other external devices. Some embodiments may utilize different types of cables or connection protocol standards to establish hardwired communication with other entities.

Trigger detection logic block 1950 can be a storage subsystem that can store one or more software programs to be executed by processors (e.g., in control component 1910). It should be understood that "software" can refer to sequences of instructions that, when executed by processing unit(s) (e.g., processors, processing devices, etc.), cause system 1900 to perform certain operations of software programs. The instructions can be stored as firmware residing in read only memory (ROM) and/or applications stored in media storage that can be read into memory for processing by processing devices. Software can be implemented as a single program or a collection of separate programs and can be stored in non-volatile storage and copied in whole or in-part to volatile working memory during program execution. From a storage subsystem, processing devices can retrieve program instructions to execute in order to execute various operations, as described herein. For instance, trigger detection logic block 1950 may include instructions to perform various functions including receiving movement data from gyroscope(s) and/or accelerometer(s) to determine if a trigger condition exists, as described in greater detail above. In an embodiment, trigger detection logic block 1950 performs the steps of method 1800 of FIG. 18.

In certain embodiments, accelerometers 1960 and gyroscopes 1970 can be used for movement and/or orientation detection. Accelerometers can be electromechanical devices (e.g., micro-electromechanical systems (MEMS) devices) configured to measure acceleration forces (e.g., static and dynamic forces). One or more accelerometers can be used to detect three dimensional (3D) positioning. Gyroscopes can measure its orientation in two or three dimensional space. They can be integrated within MEMS devices or can be separate discrete components. The use and operation of accelerometers and gyroscopes are understood by those of ordinary skill in the art.

Although certain necessary systems may not expressly discussed, they should be considered as part of system 1900, as would be understood by one of ordinary skill in the art. For example, system 1900 may include a bus system to transfer power and/or data to and from the different systems therein. Other modules and functions can be included, as would be appreciated by one of ordinary skill in the art.

It should be appreciated that system 1900 is illustrative and that variations and modifications are possible. System 1900 can have other capabilities not specifically described here. Further, while system 1900 is described with reference to particular blocks, it is to be understood that these blocks are defined for convenience of description and are not intended to imply a particular physical arrangement of component parts. Further, the blocks need not correspond to physically distinct components. Blocks can be configured to perform various operations, e.g., by programming a processor or providing appropriate control circuitry, and various blocks might or might not be reconfigurable depending on how the initial configuration is obtained. Embodiments of the present invention can be realized in a variety of apparatuses including electronic devices implemented using any combination of circuitry and software. Furthermore, aspects and/or portions of system 1900 may be combined with or operated by other sub-systems as required by design. Furthermore, system 1900 can incorporate aspects of the systems described in FIGS. 3, 4A, and 4B. That is, the various modules, components, hardware, software, firmware, etc., can be combined, as would be appreciated by one of ordinary skill in the art with the benefit of this disclosure.

It is also understood that the examples and embodiments described herein are for illustrative purposes only and that various modifications or changes in light thereof will be suggested to persons skilled in the art and are to be included within the spirit and purview of this application and scope of the appended claims.

It is also understood that the examples and embodiments described herein are for illustrative purposes only and that various modifications or changes in light thereof will be suggested to persons skilled in the art and are to be included within the spirit and purview of this application and scope of the appended claims.

What is claimed is:

1. A head-mounted electronic device comprising:
   a pair of glasses;
   an inertial motion unit including an accelerometer mounted on the pair of glasses;
   a location data unit mounted in the head-mounted electronic device;
   an output element mounted in the head-mounted electronic device for providing distance information to a user, wherein the output element is mounted on the pair of glasses and is operable to provide a visual output to a user;
   a processor mounted in the head-mounted electronic device and communicatively coupled to the inertial motion unit and the location data unit;
   a non-transitory, computer readable media mounted in the head-mounted electronic device comprising instructions to cause the processor to perform the steps of providing a distance output to the output element based on data from the inertial motion unit and the location data unit, wherein the distance output is based on the vertical movement of the accelerometer using a stride length and a cadence determined from the vertical movement; and
   a memory mounted in the head-mounted electronic device and coupled to the processor;
   wherein the location data unit comprises a GPS unit, and wherein the non-transitory, computer readable media mounted in the head-mounted electronic device further comprises instructions to cause the processor to provide the distance output based on data from the GPS unit, and based on data from the inertial motion unit when the GPS unit GPS signal is lost.

2. The head-mounted electronic device of claim 1 wherein the inertial motion unit comprises:
   an accelerometer for producing acceleration signals; and
   an atmospheric pressure sensor for producing signals indicative of altitude;
   wherein the non-transitory, computer readable media mounted in the head-mounted electronic device further comprises instructions to cause the processor to perform the steps of determining the distance based on the acceleration signals modified based on the signals indicative of altitude.

3. The head-mounted electronic device of claim 2 wherein the inertial motion unit further comprises:
   a gyroscope;
   a magnetometer; and
   wherein the non-transitory, computer readable medium is communicatively coupled to the gyroscope and the magnetometer, and further comprises instructions configured to determine route data from the signals indicative of acceleration from the accelerometer and at least one of signals indicative of compass direction from the magnetometer and signals indicative of direction changes from the gyroscope.

4. The head-mounted electronic device of claim 1 wherein the non-transitory, computer readable media mounted in the head-mounted electronic device further comprises instructions to cause the processor to
   provide the distance output based on data from the GPS unit when current GPS unit data is available,
   determine when location data is not available from the GPS unit,
   provide distance data based on data from the inertial motion unit when location data is not available from the GPS unit,
   determine when location data is again available from the GPS unit, and
   updating the distance data based on the location data from the GPS unit.

5. The head-mounted electronic device of claim 4 wherein speed data is calculated from the distance data.

6. The head-mounted electronic device of claim 1 wherein power to the location unit is reduced when a distance output based on data from the inertial unit is available.

7. An inertial motion system for a head-mounted electronic device, the inertial motion system comprising:
 a head-mounted electronic device comprising:
  an accelerometer for producing signals indicative of acceleration;
  an atmospheric pressure sensor for producing signals indicative of altitude;
  a gyroscope for producing signals indicative of direction changes; and
  a magnetometer for producing signals indicative of a compass direction;
 a GPS location unit; and
 a non-transitory, computer readable medium, communicatively coupled to the accelerometer, the atmospheric pressure sensor, the gyroscope and the magnetometer, and comprising instructions configured to determine route data from the signals indicative of acceleration from the accelerometer and at least one of the signals indicative of compass direction from the magnetometer and the signals indicative of direction changes from the gyroscope, and distance data based on the vertical movement of the accelerometer using a stride length and a cadence determined from the vertical movement.

8. The inertial motion system of claim 7 further comprising an output element operable to provide a visual output to a user of the route data, and also elevation data based on the signals indicative of altitude.

9. The head-mounted electronic device of claim 1 wherein the output element comprises a plurality of light emitting diodes.

10. The inertial motion system of claim 7 further comprising an output element operable to provide an audio output to a user.

11. A system for a glasses-mounted electronic device comprising:
 an inertial motion unit including:
  an accelerometer;
  an atmospheric pressure sensor;
  a gyroscope; and
  a magnetometer;
 an output element;
 a non-transitory, computer readable medium, communicatively coupled to the inertial motion unit and a source of location data, and comprising instructions configured to
 determine route data from the signals indicative of acceleration from the accelerometer and at least one of the signals indicative of compass direction from the magnetometer and the signals indicative of direction changes from the gyroscope,
 to provide a distance output to the output element based on data from the inertial motion unit and a location data unit, wherein the distance output is based on the vertical movement of the accelerometer using a stride length and a cadence determined from the vertical movement,
 wherein the distance output is based on the acceleration signals modified based on signals indicative of altitude, and
 wherein the distance output is based on data from the location unit, and based on data from the inertial motion unit in the absence of data from the location unit; and
 wherein the output element is glasses-mounted and is operable to provide a visual output to a user.

12. The glasses-mounted electronic device of claim 11 wherein the output element comprises a plurality of light emitting diodes.

13. The glasses-mounted electronic device of claim 11 wherein the output element comprises a display screen.

14. The glasses-mounted electronic device of claim 11 wherein the output element is operable to provide an audio output to the user.

15. The glasses-mounted electronic device of claim 11 wherein the accelerometer comprises a three-axis accelerometer and wherein the non-transitory, computer readable media mounted in the glasses-mounted electronic device further comprises instructions to cause a processor to use one axis of the accelerometer to indicate vertical movement corresponding to foot contact to measure the distance while the other axes are used to discriminate natural events not indicative of distance by eliminating vertical movement in the one axis where there is also movement in the other axes indicating such natural events not indicative of distance.

16. The glasses-mounted electronic device of claim 11 wherein the instructions are further configured to
 provide the distance output based on data from the location unit when current location unit data is available,
 determine when location data is not available from the location unit,
 provide distance data based on data from the inertial motion unit in when location data is not available the location unit,
 determine when location data is again available from the location unit, and
 updating the distance data based on the location data from the location unit.

17. The glasses-mounted electronic device of claim 11 wherein speed data is calculated from the distance data.

18. The glasses-mounted electronic device of claim 11 wherein the instructions are further configured to reduce power to the location unit when a distance output based on data from the inertial unit is available.

* * * * *